(12) United States Patent
Chen et al.

(10) Patent No.: US 11,594,832 B2
(45) Date of Patent: Feb. 28, 2023

(54) ELECTRONIC DEVICES FOR EXPANSION

(71) Applicant: SUPER MICRO COMPUTER, INC., San Jose, CA (US)

(72) Inventors: Hsiao Chung Chen, San Jose, CA (US); Tan Hsin Chang, San Jose, CA (US); Yueh Ming Liu, San Jose, CA (US); Yu Chuan Chang, San Jose, CA (US); Hung Chieh Chang, San Jose, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 162 days.

(21) Appl. No.: 16/790,432

(22) Filed: Feb. 13, 2020

(65) Prior Publication Data

US 2021/0257761 A1 Aug. 19, 2021

(51) Int. Cl.
*H01R 12/72* (2011.01)
*H05K 7/14* (2006.01)
*G06F 1/18* (2006.01)
*H01R 13/62* (2006.01)

(52) U.S. Cl.
CPC .......... *H01R 12/721* (2013.01); *G06F 1/185* (2013.01); *G06F 1/186* (2013.01); *H01R 13/62* (2013.01); *H05K 7/1485* (2013.01); *G06F 2213/0026* (2013.01)

(58) Field of Classification Search
CPC .... H01R 9/0515; H01R 9/0733; H01R 9/091; H01R 9/097; H01R 9/098; H01R 13/62; H01R 13/6658; H01R 13/7034; H01R 12/00; H01R 12/523; H01R 12/526; H01R 12/721; H01R 24/50; H01R 23/68; G06F 1/185; G06F 1/186; G06F 2213/0026
See application file for complete search history.

(56) References Cited

U.S. PATENT DOCUMENTS

| | | | | |
|---|---|---|---|---|
| 5,500,786 A | * | 3/1996 | Ono | H05K 1/0256 174/361 |
| 7,641,518 B2 | * | 1/2010 | Lee | H01R 13/6666 439/660 |
| 10,714,885 B2 | * | 7/2020 | Sugiyama | H05K 1/181 |
| 2007/0214299 A1 | * | 9/2007 | Lo | G06F 1/185 710/301 |
| 2013/0042041 A1 | * | 2/2013 | Sun | G06F 13/409 710/301 |

\* cited by examiner

*Primary Examiner* — Jean F Duverne
(74) *Attorney, Agent, or Firm* — WPAT, P.C., Intellectual Property Attorneys; Anthony King

(57) ABSTRACT

The present disclosure is related to electronic devices. At least some embodiments of the present disclosure relate to an electronic device comprising a circuit board, a first connector, and a second connector. The first connector and the second connector are disposed on the circuit board. The first connector is different from the second connector. The second connector is adjacent to the first connector. The first connector is arranged along a reference line in a first direction, and the second connector is adjacent to the reference line in the first direction.

20 Claims, 15 Drawing Sheets

ELECTRONIC DEVICES FOR EXPANSION

TECHNICAL FIELD

The present disclosure is related to electronic devices. In particular, the present disclosure is related to electronic devices for hybrid interconnection.

BACKGROUND

Servers for different purposes need different combinations of peripheral expansion, such as Peripheral Component Interconnect Express (PCIe) slots. Different models of mainboard are used in order to accommodate the requirements of different peripheral expansion slot arrays. For the different models of mainboards, different sets of firmware (e.g., BIOS (Basic Input/Output System) firmware) must be maintained. Some peripheral expansion cards may not be mountable to a mainboard or chassis because of size considerations.

SUMMARY

In accordance with some embodiments of the present disclosure, an electronic device comprises a circuit board, a first connector, and a second connector. The first connector and the second connector are disposed on the circuit board. The first connector is different from the second connector. The second connector is adjacent to the first connector. The first connector is arranged along a reference line in a first direction, and the second connector is adjacent to the reference line in the first direction.

In accordance with some embodiments of the present disclosure, an electronic device comprises a circuit board, a first connector, a second connector, and a third connector. The first connector and the second connector are different. The first connector is arranged along a reference line in a first direction, and the second connector is close to the reference line in the first direction. The orientation of the third connector is perpendicular to the orientation of the first connector, and the orientation of the third connector is perpendicular to the orientation of the second connector.

DETAILED DESCRIPTION

Figure 1:
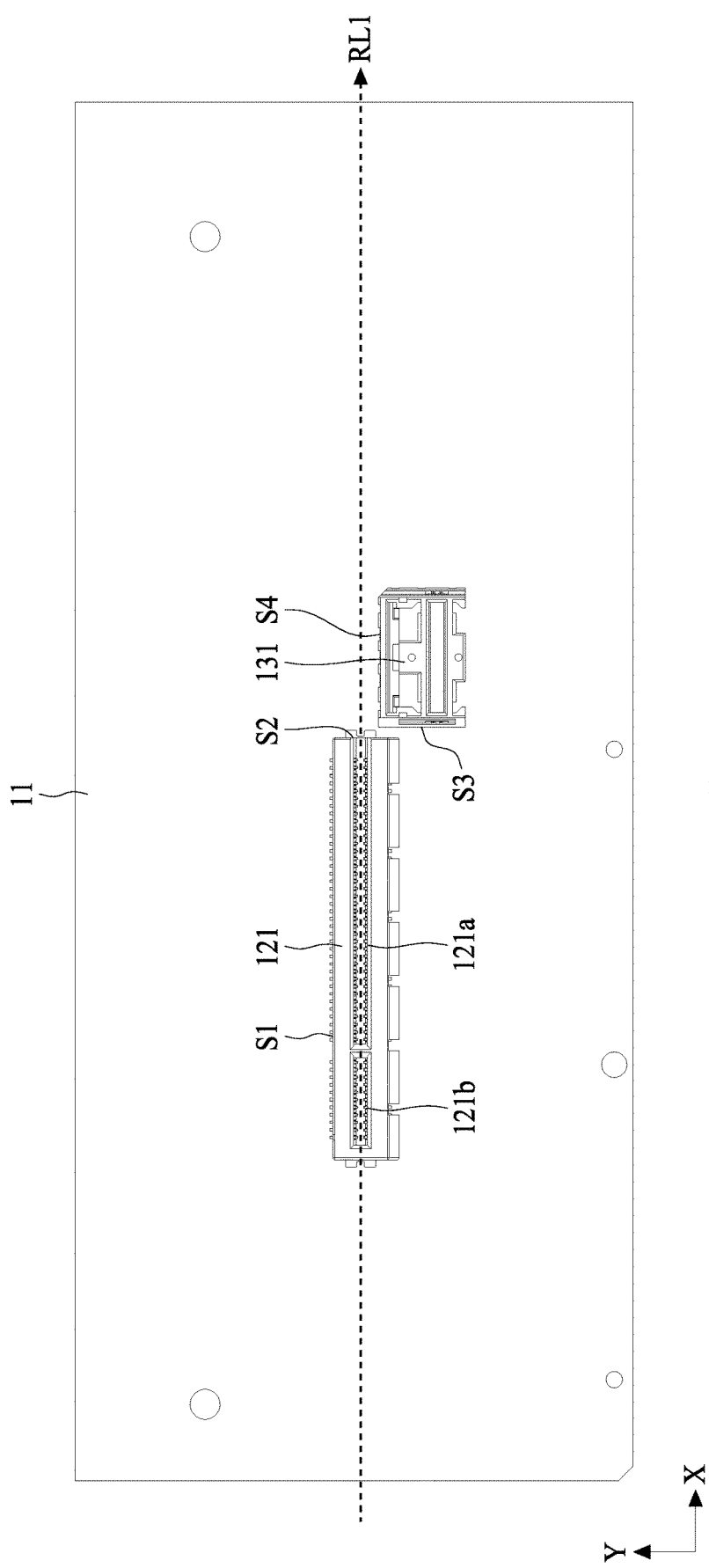
FIG. 1 is a top schematic view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "perpendicular," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The present disclosure describes an electronic device, in which the numbers of peripheral expansion slots is extensible. The present disclosure describes an electronic device for expanding the numbers of peripheral expansion slots.

FIG. 1 is a top schematic view of an electronic device according to some embodiments of the present disclosure. FIG. 1 depicts an electronic device 101. In some embodiments, the electronic device 101 may include a mainboard (or motherboard). The electronic device 101 may include a printed circuit board (PCB) 11. The PCB 11 may include a connector 121 and a connector 131. The connector 121 may be disposed on the PCB 11. The connector 131 may be disposed on the PCB 11.

In some embodiments, the connector 121 may be a connector compatible with PCIe standard. In some embodiments, the connector 121 may be a female connector compatible with PCIe 4.0 X8 standard. In some embodiments, the connector 121 may be a female connector compatible with PCIe 4.0 X16 standard. In some embodiments, the connector 121 may be a card-edge connector compatible with PCIe 4.0 X8 standard. In some embodiments, the connector 121 may be a card-edge connector compatible with PCIe 4.0 X16 standard.

In some embodiments, the connector 131 may be a board-to-board connector. In some embodiments, the connector 131 may be a board-to-board female connector. In some embodiments, the connector 131 may be a board-to-board male connector. In some embodiments, the connector 131 may be a board-to-board connector of IT9 ™ series from Hirose Electric Co., LTD. In some embodiments, the connector 131 may be a board-to-board female connector of IT9™ series from Hirose Electric Co., LTD. In some embodiments, the connector 131 may be a board-to-board male connector of IT9 ™ series from Hirose Electric Co., LTD.

Referring to FIG. 1, the connectors 121 and 131 may be different. The shapes of the connectors 121 and 131 may be different. The areas of the connectors 121 and 131 may be different. The pins of the connectors 121 and 131 may be different. In some embodiments, the signals of the connectors 121 and 131 may be compatible. In some embodiments, the connector 131 may be configured to transmit the signals compatible with those transmitted on the connector 121. For example, both the connectors 121 and 131 may transmit signals compatible with any one of PCIe 1.0 to PCIe 5.0 standards.

In some embodiments, the power supplying to the connectors 121 and 131 may be compatible. In some embodiments, the connector 131 may be configured to provide power compatible with that provided on the connector 121. For example, the connectors 121 and 131 may provide power compatible with any one of PCIe 1.0 to PCIe 5.0 standards from the PCB 11 to electronic devices connected to the connectors 121 and 131. It should be noted that the connector 131 may be configured to transmit signals. It should be noted that the connector 131 may be configured to provide power.

The connector 121 may include portions 121*a* and 121*b*. In some embodiments, the portion 121*a* of the connector 121 may transmit signals. In some embodiments, the portion 121*b* of the connector 121 may provide power. For example, according to any one of PCIe 1.0 to PCIe 5.0 standards, the portion 121*a* of the connector 121 may transmit signals, and the portion 121*b* of the connector 121 may provide power. It should be noted that the connector 121 may be configured to transmit signals. It should be noted that the connector 121 may be configured to provide power. It should be noted that the connector 121 may transmit signals and provide power simultaneously.

A PCIe connector (e.g., the connector 121) is a standard connector widely used in the art. A board-to-board connector (e.g., the connector 131) is not a standard connector widely used in the art. A PCIe connector cannot be replaced by a board-to-board connector. A board-to-board connector may not be solely used on a mother board. In the field of the disclosure, a board-to-board connector was not used together with a PCIe connector on a mother board.

Standard PCIe connectors may be used on a mother board if no spatial limitation of the mother board is taken into consideration. Non-standard board-to-board connectors may be used on a mother board if spatial limitation of the mother board is taken into consideration. Generally, the cost of using board-to-board connectors is more expensive than that of using PCIe connectors. The cost will be increase if board-to-board connectors are used on a mother board. In the field of the disclosure, PCIe connectors and board-to-board connector were not used together on a mother board because of additional processes (e.g., anti-oxidation process for the mother board). In the field of the disclosure, PCIe connectors and board-to-board connector were not used together on a mother board because of cost.

Referring to FIG. 1, the connector 121 may include side S1 and side S2. The connector 131 may include side S3 and side S4. In some embodiments, the side S1 and the X-axis may be parallel. In some embodiments, the side S4 and the X-axis may be parallel. In some embodiments, the sides S1 and S4 and the X-axis may be parallel. In some embodiments, the side S2 and the Y-axis may be parallel. In some embodiments, the side S3 and the Y-axis may be parallel. In some embodiments, the sides S2 and S3 and the Y-axis may be parallel. In some embodiments, the sides S1 and S2 may be perpendicular. In some embodiments, the sides S3 and S4 may be perpendicular. In some embodiments, both the sides S1 and S4 may be perpendicular to the Y-axis. In some embodiments, both the sides S2 and S3 may be perpendicular to the X-axis.

Referring to FIG. 1, the connector 131 may be close to the connector 121. The connector 131 may be adjacent to the connector 121. The side S2 of the connector 121 may be adjacent to the side S3 of the connector 131. The distance between the connector 121 and the connector 131 may be arranged so that the connector 121 and the connector 131 do not physically interfere with each other. The distance between the connector 121 and the connector 131 may be arranged so that the connector 121 and the connector 131 do not interfere with each other in communication. The distance between the connector 121 and the connector 131 may be approximately ranged from 1 mm to 100 mm. The distance between the connector 121 and the connector 131 may be approximately ranged from 1 mm to 50 mm. The distance between the connector 121 and the connector 131 may be approximately ranged from 1 mm to 10 mm.

The distance between the side S2 of the connector 121 and the side S3 of the connector 131 may be arranged so that the connector 121 and the connector 131 do not physically interfere with each other. The distance between the side S2 of the connector 121 and the side S3 of the connector 131 may be arranged so that the connector 121 and the connector 131 do not interfere with each other in communication. The distance between the side S2 of the connector 121 and the side S3 of the connector 131 may be approximately ranged from 1 mm to 100 mm. The distance between the side S2 of the connector 121 and the side S3 of the connector 131 may be preferably approximately ranged from 1 mm to 50 mm. The distance between the side S2 of the connector 121 and the side S3 of the connector 131 may be more preferably approximately ranged from 1 mm to 10 mm.

FIG. 1 shows a reference line RL1. It should be noted that the reference line RL1 is a virtual line. It should be noted that the reference line RL1 is a virtual line for locating the positions of the components (e.g., including, but not limited to, connectors 121 and 131). It should be noted that the reference line RL1 is a virtual line for locating the positions of the components (e.g., including, but not limited to, connectors 121 and 131) disposed on the PCB 11. It should be noted that the reference line RL1 is a virtual line for locating the relative positions of the components (e.g., including, but not limited to, connectors 121 and 131) disposed on the PCB 11. The reference line RL1 may be in parallel with the X-axis. The reference line RL1 may cross the side S2 of the connector 121. The reference line RL1 may extend along the central line of the connector 121, in which the central line of the connector 121 may be parallel to the X-axis. The reference line RL1 may overlap the central line of the connector 121, in which the central line of the connector 121 may be parallel to the X-axis. The reference line RL1 may extend along the central line of the slot of the connector 121, in which the slot may be used for receiving golden fingers of a card-edge device (e.g., a peripheral expansion card). The reference line RL1 may overlap the central line of the slot of the connector 121, in which the slot may be used for receiving golden fingers of a card-edge device (e.g., a peripheral expansion card). The reference line RL1 may be aligned with the slot of the connector 121, in which the slot may be used for receiving golden fingers of a card-edge device (e.g., a peripheral expansion card).

Referring to FIG. 1, the connector 131 may be adjacent to the reference line RL1. The side S4 of the connector 131 may be adjacent to the reference line RL1. The distance between the reference line RL1 and the connector 131 may be approximately ranged from 1 mm to 5 mm. The distance between the reference line RL1 and the side S4 of the connector 131 may be preferably approximately ranged from 1 mm to 3 mm. The distance between the reference line RL1 and the side S4 of the connector 131 may be more preferably approximately 2.4 mm.

The electronic device 101 may further include at least one processor and at least one memory (not shown). In some embodiments, the electronic device 101 may include at least one processor socket and at least one memory socket (not shown). In some embodiments, the electronic device 101 may include circuits for coupling the connectors 121 and 131, processors, and memory. In some embodiments, the electronic device 101 may include circuits for coupling the connectors 121, 131, processor sockets, and memory sockets. In some embodiments, the connector 121 may be coupled to one processor in communication. In some embodiments, the connector 131 may be coupled to one processor in communication. In some embodiments, the connectors 121 and 131 may be coupled to one processor in communication. In some embodiments, the connectors 121, 131 may be coupled to different processors in communication.

In some embodiments, the connectors 121 and 131 may be coupled to one processor (or processor socket) in communication, and the bandwidths provided by the connectors 121 and 131 may be coupled together. In some embodiments, the connectors 121 and 131 may be coupled to one processor (or processor socket) in communication, and the bandwidths provided by the connectors 121 and 131 may not be coupled together. In some embodiments, the connectors 121 and 131 may be coupled to different processors (or different processor sockets) in communication, and the bandwidths provided by the connectors 121 and 131 may be not coupled together. In some embodiments, the connector 121 may be a standard connector for any one of PCIe 4.0 X8, PCIe 4.0 X16, and PCIe 4.0 X32. In some embodiments, the bandwidth provided by the connector 131 may be the same as that provided by a standard connector for any one of PCIe 4.0 X8 and PCIe4.0 X16.

In some embodiments, the areas on the PCB 11 occupied by the connector 131 may be smaller than that occupied by the connector 121. The connector 121 may be a PCIe connector. The connector 131 may be a board-to-board connector. The connectors 121 and 131 may form a hybrid connection structure. The connectors 121 and 131 may establish a hybrid connection structure. The connectors 121 and 131 may form a hybrid connection structure on the PCB 11.

Figure 2A:
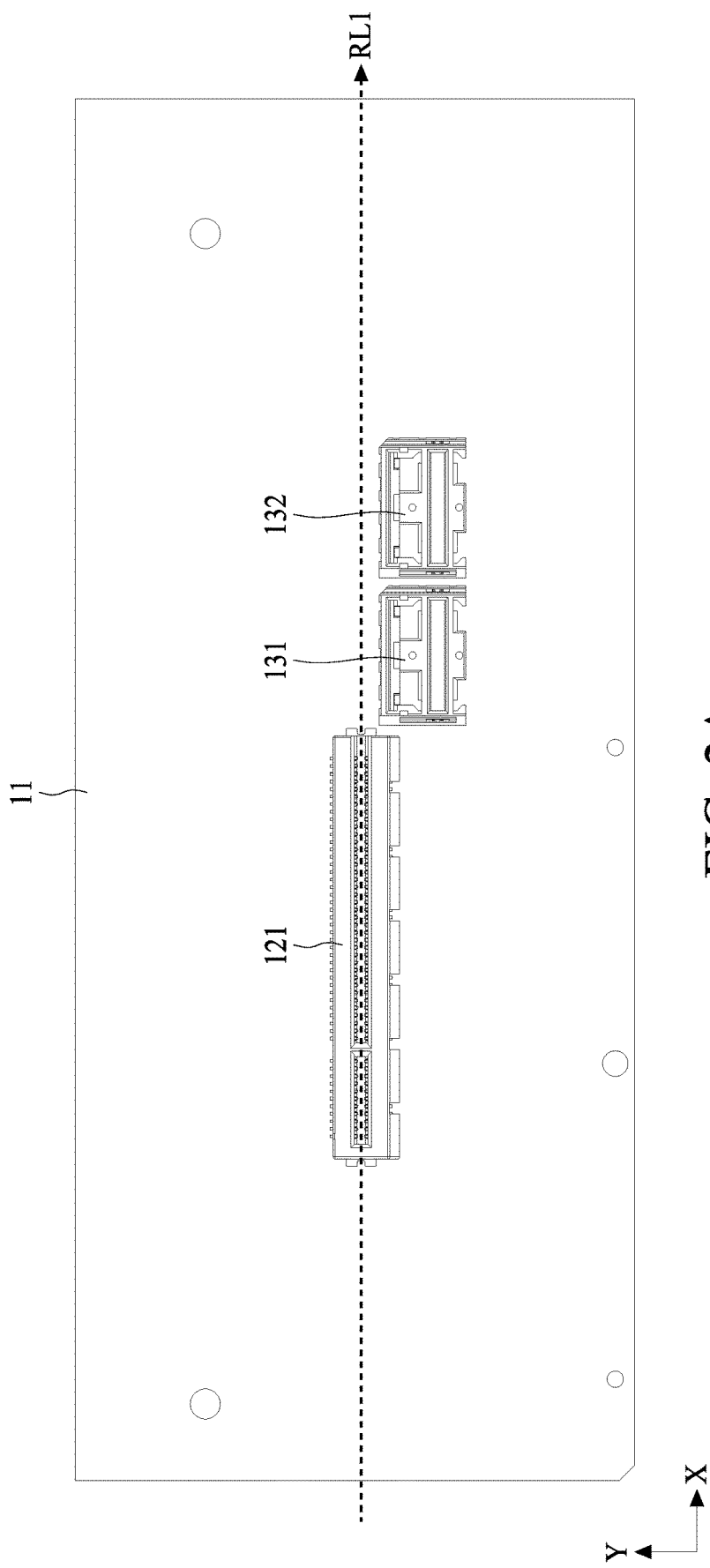
FIG. 2A is a top schematic view of an electronic device according to some embodiments of the present disclosure.
Figure 2B:
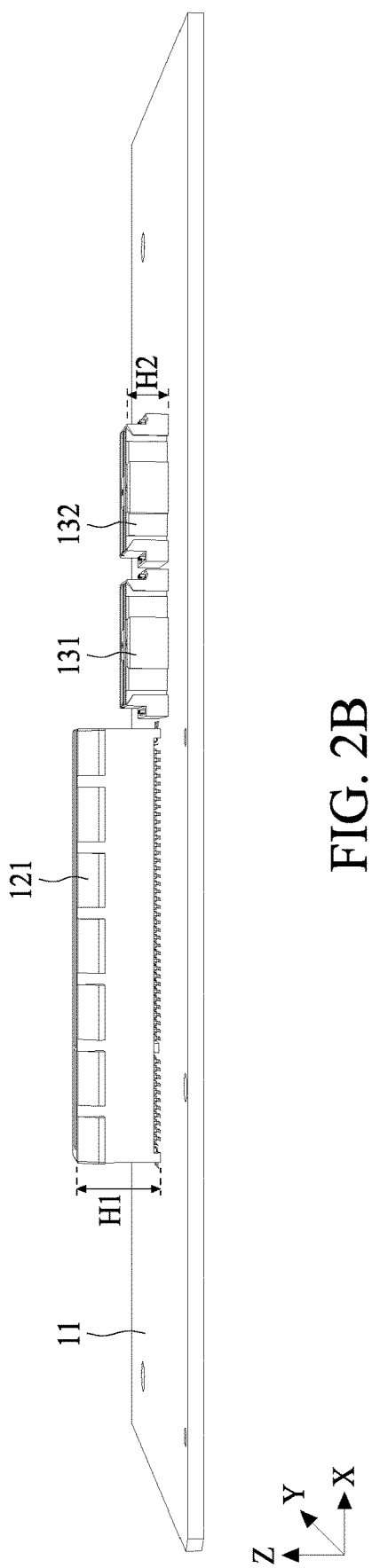
FIG. 2B is a three-dimensional (3D) schematic view of an electronic device according to some embodiments of the present disclosure.

FIGS. 2A and 2B illustrate an electronic device 102.

FIG. 2A is a top schematic view of an electronic device according to some embodiments of the present disclosure. FIG. 2A depicts the electronic device 102. FIG. 2A is a top schematic view of the electronic device 102. In some embodiments, the electronic device 102 may be a mainboard (or motherboard). The electronic device 102 shown in FIG. 2A is similar to the electronic device 101 shown in FIG. 1, but differs in that the electronic device 102 may further include a connector 132. The connector 132 may be disposed on the PCB 11.

In some embodiments, the connector 132 may be a board-to-board connector. In some embodiments, the connector 132 may be a board-to-board female connector. In some embodiments, the connector 132 may be a board-to-board male connector. In some embodiments, the connector 132 may be a board-to-board connector of IT9 series from Hirose Electric Co., LTD. In some embodiments, the connector 132 may be a board-to-board female connector of IT9 series from Hirose Electric Co., LTD. In some embodiments, the connector 132 may be a board-to-board male connector of IT9 series from Hirose Electric Co., LTD.

Referring to FIG. 2A, the connectors 131 and 132 may be identical. The shapes of the connectors 131 and 132 may be identical. The areas of the connectors 131 and 132 may be identical. The pins of the connectors 131 and 132 may be identical. In some embodiments, the signals of the connectors 131 and 132 may be compatible. In some embodiments, the connector 132 may be configured to transmit the signals compatible with those transmitted on the connector 131. For example, both the connectors 131 and 132 may transmit signals compatible with any one of PCIe 1.0 to PCIe 5.0 standards. In some embodiments, the connector 132 may be configured to transmit the signals compatible with those transmitted on the connector 121. For example, both the connectors 121 and 132 may transmit signals compatible with any one of PCIe 1.0 to PCIe 5.0 standards.

Referring to FIG. 2A, the connector 132 may be arranged in parallel with the connector 131. The connector 132 may be arranged in parallel with the connector 131 along the Y-axis direction. The connector 132 may be arranged next to the connector 131. The connector 132 may be adjacent to the connector 131. The connectors 131 and 132 may be arranged side by side. The connector 132 may be adjacent to reference line RL1. The connectors 131 and 132 may be adjacent to the reference line RL1. The distance between the reference line RL1 and the connector 132 may be approximately ranged from 1 mm to 5 mm. The distance between the reference line RL1 and the connector 132 may be preferably approximately ranged from 1 mm to 3 mm. The distance between the reference line RL1 and the connector 132 may be more preferably approximately 2.4 mm. The distance between the reference line RL1 and the side of the connector 132 which is the nearest side to the reference line RL1 may be more preferably approximately 2.4 mm.

In some embodiments, the power supplying to the connectors 121, 131, and 132 may be compatible. In some embodiments, the connector 132 may be configured to provide power compatible with that provided on the connector 121.

It should be noted that the connector 132 may be configured to transmit signals. It should be noted that the connector 132 may be configured to provide power. In some embodiments, both of the connector 131 and 132 may be configured to transmit signals, and neither provides power. In some embodiments, both of the connectors 131 and 132 may be configured to provide power, and neither transmits signals. In some embodiments, one of the connector 131 and 132 may be configured to transmit signals, and the other to provide power.

In some embodiments, the areas on the PCB 11 occupied by the connector 132 may be smaller than that occupied by the connector 121. The connector 121 may be a PCIe connector. The connector 132 may be a board-to-board connector. The connectors 121 and 132 may form a hybrid connection structure. The connectors 121 and 132 may establish a hybrid connection structure. The connectors 121 and 132 may form a hybrid connection structure on the PCB 11. The connectors 121, 131 and 132 may form a hybrid connection structure. The connectors 121, 131 and 132 may establish a hybrid connection structure. The connectors 121, 131 and 132 may form a hybrid connection structure on the PCB 11.

FIG. 2B is a 3D schematic view of an electronic device according to some embodiments of the present disclosure. Similar to FIG. 2A, FIG. 2B depicts the electronic device 102. FIG. 2B is a 3D schematic view of the electronic device 102. The electronic device 102 may include connectors 121, 131, and 132. The connectors 121, 131, and 132 may be disposed on the PCB 11.

Referring to FIG. 2B, the connector 121 may have a height H1. The height H1 may be measured from the PCB 11. The height H1 may be measured from the upper surface of the PCB 11. The height H1 may be measured from the upper surface of the PCB 11 to the top of the connector 121. The height H1 may be in the Z-axis direction. The connector 131 may have a height H2. The height H2 may be measured from the PCB 11. The height H2 may be measured from the upper surface of the PCB 11. The height H2 may be measured from the upper surface of the PCB 11 to the top of the connector 131. The height H2 may be in the Z-axis direction. The connector 132 may have a height H2. The height H2 may be measured from the upper surface of the PCB 11 to the top of the connector 132. The connectors 131 and 132 may have the same height, H2.

The height H2 may be smaller than the height H1. The height H2 may be smaller than the height H1 so that the connector 131 would not interfere with the connection of the connector 121. The height H2 may be smaller than the height H1 so that the connector 132 would not interfere with the connection of the connector 121. The height H2 may be smaller than the height H1 so that the connectors 131 and 132 would not interfere with the connection of the connector 121.

Figure 3A:
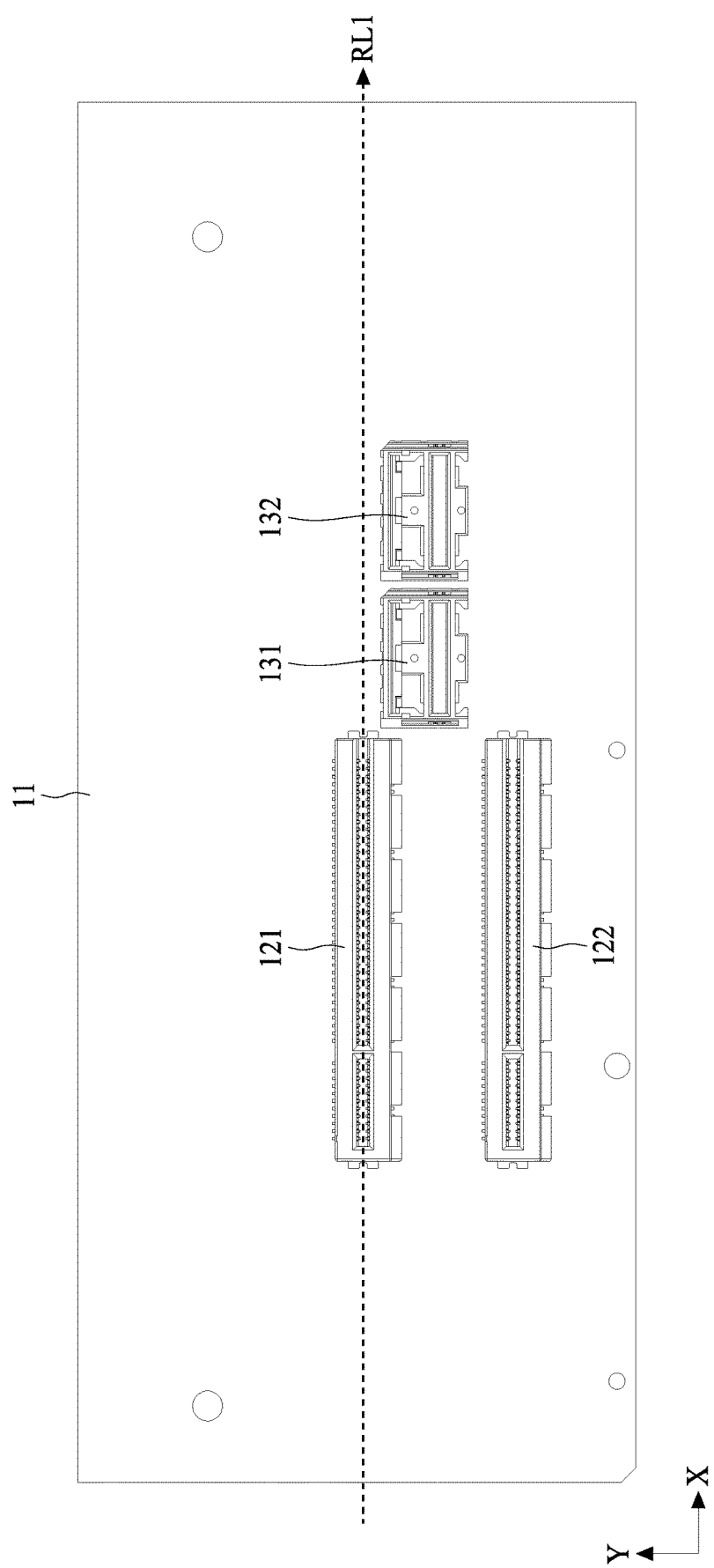
FIG. 3A is a top schematic view of an electronic device according to some embodiments of the present disclosure.
Figure 3B:
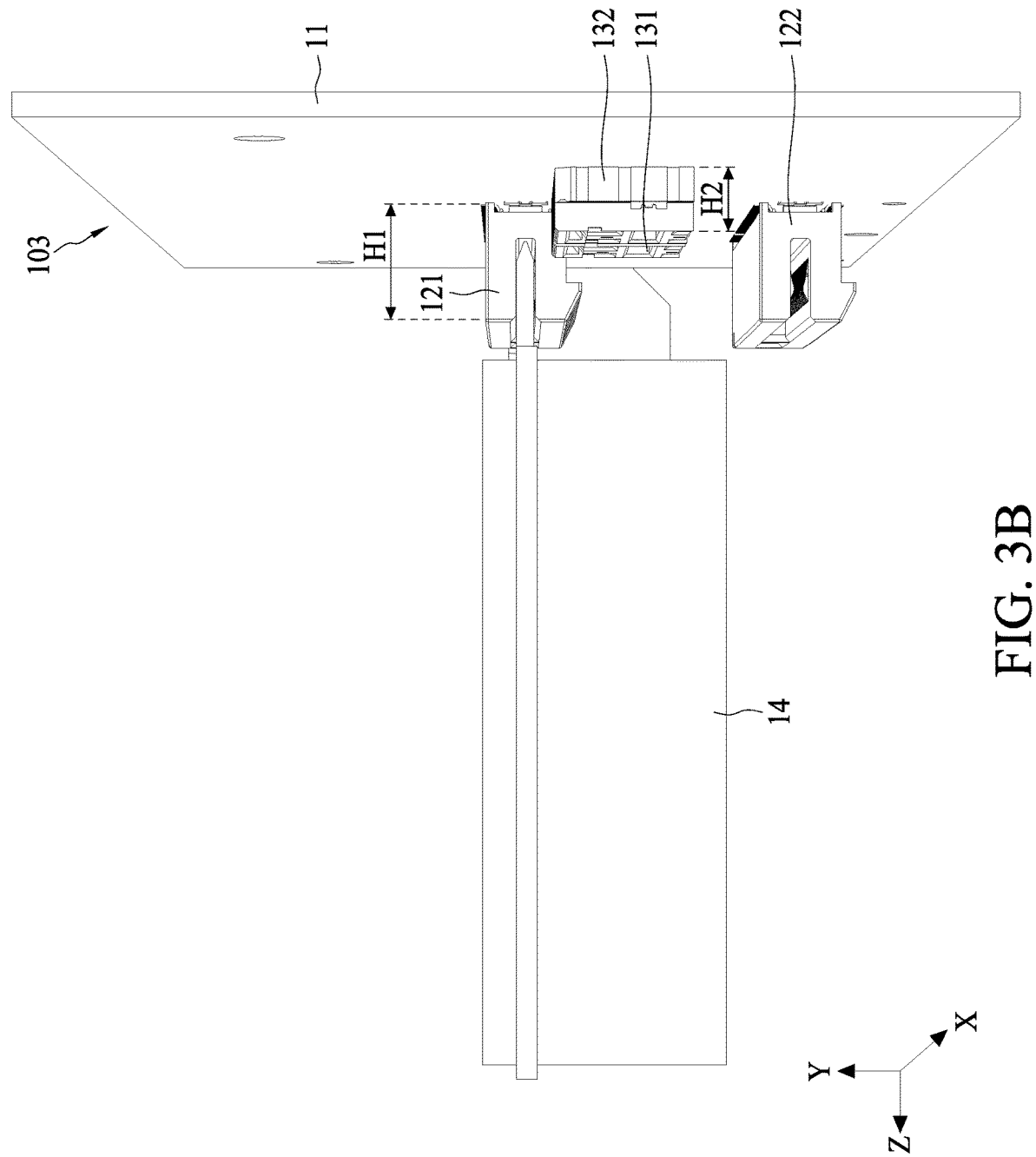
FIG. 3B is a 3D schematic view of electronic devices according to some embodiments of the present disclosure.
Figure 3C:
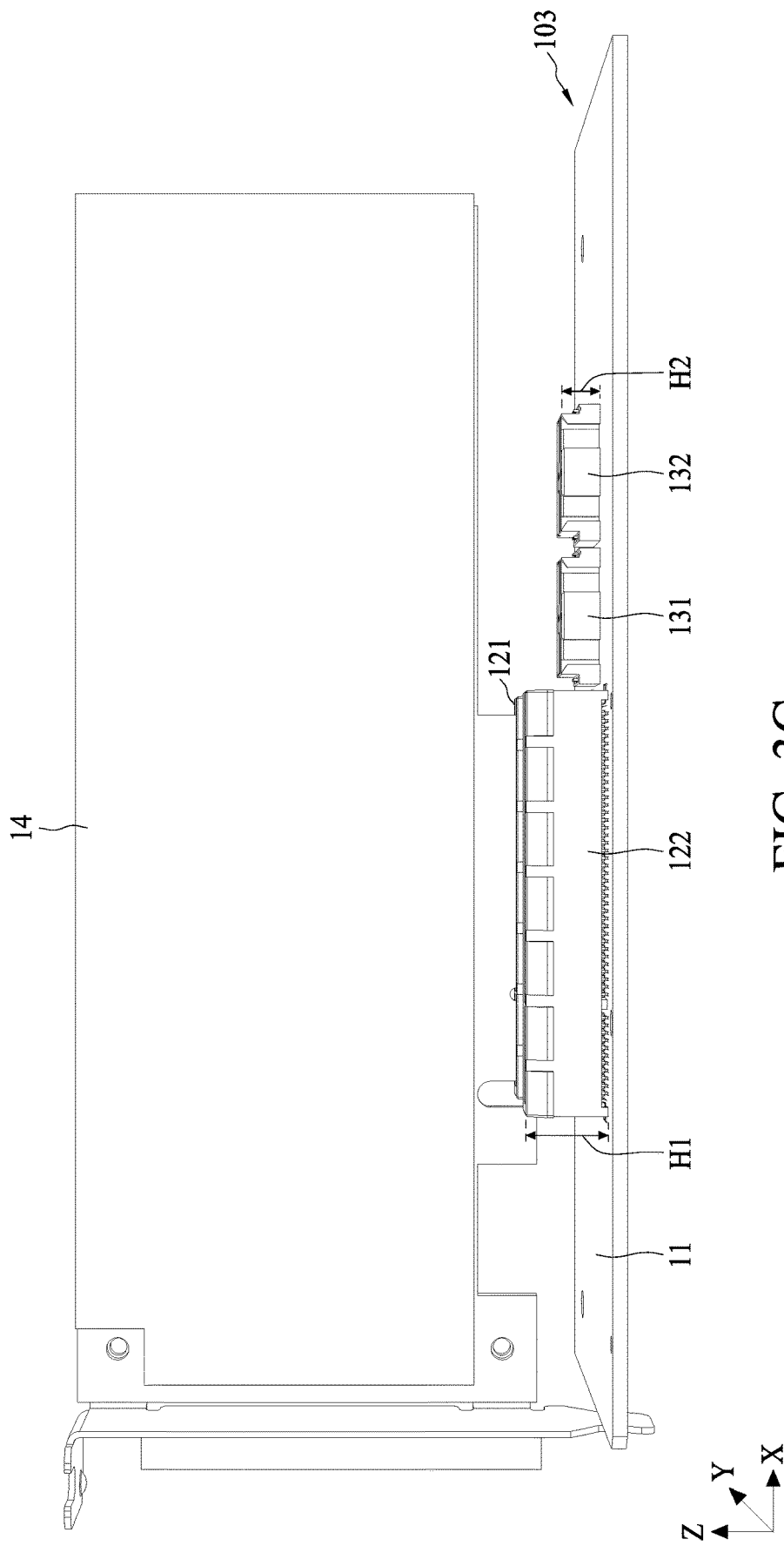
FIG. 3C is a 3D schematic view of electronic devices according to some embodiments of the present disclosure.

FIGS. 3A, 3B and 3C illustrate an electronic device 103. FIGS. 3B and 3C further illustrate an electronic device 14.

FIG. 3A is a top schematic view of an electronic device according to some embodiments of the present disclosure. FIG. 3A depicts the electronic device 103. FIG. 3A is a top schematic view of the electronic device 103. In some embodiments, the electronic device 103 may be a mainboard (or motherboard). The electronic device 103 shown in FIG. 3A is similar to the electronic device 102 shown in FIG. 2A, but differs in that the electronic device 103 may further include a connector 122. The connector 122 may be disposed on the PCB 11.

In some embodiments, the connector 122 may be a connector compatible with PCIe standard. In some embodiments, the connector 122 may be a female connector compatible with PCIe 4.0 X8 standard. In some embodiments, the connector 122 may be a female connector compatible with PCIe 4.0 X16 standard. In some embodiments, the connector 122 may be a card-edge connector compatible with PCIe 4.0 X8 standard. In some embodiments, the connector 122 may be a card-edge connector compatible with PCIe 4.0 X16 standard.

Referring to FIG. 3A, the connectors 122 and 131 may be different. The shapes of the connectors 122 and 131 may be different. The areas of the connectors 122 and 131 may be different. The pins of the connectors 122 and 131 may be different. In some embodiments, the signals of the connectors 122 and 131 may be compatible. In some embodiments, the connector 122 may be configured to transmit the signals compatible with those transmitted on the connector 131. For example, both the connectors 122 and 131 may transmit signals compatible with any one of PCIe 1.0 to PCIe 5.0 standards.

Referring to FIG. 3A, the connectors 121 and 122 may be identical. The shapes of the connectors 121 and 122 may be identical. The areas of the connectors 121 and 122 may be identical. The pins of the connectors 121 and 122 may be identical. In some embodiments, the signals of the connectors 121 and 122 may be compatible. In some embodiments, the connector 122 may be configured to transmit the signals compatible with those transmitted on the connector 121. For example, both the connectors 121 and 122 may transmit signals compatible with any one of PCIe 1.0 to PCIe 5.0 standards. In some embodiments, the connector 122 may be configured to transmit the signals compatible with those transmitted on the connector 121. For example, both the connectors 121 and 122 may transmit signals compatible with any one of PCIe 1.0 to PCIe 5.0 standards.

Referring to FIG. 3A, the connector 122 may be arranged in parallel with the connector 121. The connector 122 may be arranged in parallel with the connector 121 along the X-axis direction. The connector 122 may be arranged next to the connector 121. The connector 122 may be adjacent to the connector 121. The connectors 121 and 122 may be arranged side by side. The connector 122 may be adjacent to reference line RL1. The connector 122 may have a long side parallel to reference line RL1. The connector 122 may have a short side perpendicular to reference line RL1. The distance between the reference line RL1 and the connector 122 may be approximately ranged from 10 mm to 30 mm. The distance between the reference line RL1 and the connector 122 may be preferably approximately ranged from 15 mm to 25 mm. The distance between the reference line RL1 and the connector 122 may be more preferably approximately 20.32 mm. The distance between the reference line RL1 and the slot of the connector 122 may be more preferably approximately 20.32 mm. The distance between the slot of the connector 121 and the slot of the connector 122 may be more preferably approximately 20.32 mm.

In some embodiments, the power supplying to the connectors 121, 122, 131, and 132 may be compatible. In some embodiments, the connector 122 may be configured to provide power compatible with that provided on the connector 121.

In some embodiments, the areas on the PCB 11 occupied by the connector 131 may be smaller than that occupied by the connector 122. The connector 122 may be a PCIe connector. The connector 131 may be a board-to-board connector. The connectors 121, 131 and 132 may form a hybrid connection structure. The connectors 121, 131 and 132 may establish a hybrid connection structure. The connectors 121, 131 and 132 may form a hybrid connection structure on the PCB 11.

FIG. 3B is a 3D schematic view of electronic devices according to some embodiments of the present disclosure. Similar to FIG. 3A, FIG. 3B depicts the electronic device 103. FIG. 3B further depicts the electronic device 14. FIG. 3B is a 3D schematic view of the electronic device 103 and the electronic device 14. The electronic device 103 may include connectors 121, 122, 131, and 132. The connectors 121, 122, 131, and 132 may be disposed on the PCB 11.

Referring to FIG. 3B, the electronic device 14 may be connected to the electronic device 103. In some embodiments, the electronic device 14 may be connected to the electronic device 103 through coupling card-edge golden fingers of the electronic device 14 to the connector 121. In some embodiments, the electronic device 14 may be connected to the electronic device 103 by inserting card-edge golden fingers of the electronic device 14 into the connector 121. In some embodiments, the electronic device 14 may be a peripheral expansion card. In some embodiments, the connector 121 may be a card-edge connector.

Referring to FIG. 3B, the distance between the connectors 121 and 122 may be arranged such that, the connector 122 would not interfere with the connection between the connector 121 and the electronic device 14. The distance between the connectors 121 and 122 may be arranged such that, the connector 122 would not physically interfere with the connection between the connector 121 and the electronic device 14. The distance between the connectors 121 and 122 may be arranged such that, the device (not shown) to be connected to the connector 122 would not interfere with the electronic device 14. The distance between the connectors 121 and 122 may be arranged such that, the device (not shown) to be connected to the connector 122 would not physically interfere with the electronic device 14.

Referring to FIG. 3B, the connector 121 may have a height H1. The height H1 may be measured from the PCB 11. The height H1 may be measured from the upper surface of the PCB 11. The height H1 may be measured from the upper surface of the PCB 11 to the top of the connector 121. The height H1 may be in the Z-axis direction. The connector 122 may have a height H1. The height H1 may be measured from the upper surface of the PCB 11 to the top of the connector 122. The connectors 121 and 122 may have the same height, H1. The connector 131 may have a height H2. The height H2 may be measured from the PCB 11. The height H2 may be measured from the upper surface of the PCB 11. The height H2 may be measured from the upper surface of the PCB 11 to the top of the connector 131. The height H2 may be in the Z-axis direction. The connector 132 may have a height H2. The height H2 may be measured from the upper surface of the PCB 11 to the top of the connector 132. The connectors 131 and 132 may have the same height, H2.

The height H2 may be smaller than the height H1. The height H2 may be smaller than the height H1 so that the connector 131 would not interfere with the connection of the connector 121. The height H2 may be smaller than the height H1 so that the connector 132 would not interfere with the connection of the connector 121. The height H2 may be smaller than the height H1 so that the connectors 131 and 132 would not interfere with the connection of the connector 121. The height H2 may be smaller than the height H1 so that the connectors 131 and 132 would not interfere with the connection between the connector 121 and the electronic device 14. The height H2 may be smaller than the height H1 so that the connector 131 would not interfere with the connection of the connector 122. The height H2 may be smaller than the height H1 so that the connector 132 would not interfere with the connection of the connector 122. The height H2 may be smaller than the height H1 so that the connectors 131 and 132 would not interfere with the connection of the connector 122.

FIG. 3C is a 3D schematic view of electronic devices according to some embodiments of the present disclosure. Similar to FIG. 3A, FIG. 3C depicts the electronic device 103. FIG. 3C further depicts the electronic device 14. FIG. 3C is a 3D schematic view of the electronic device 103 and the electronic device 14. The electronic device 103 may include connectors 121, 122, 131, and 132. The connectors 121, 122, 131, and 132 may be disposed on the PCB 11.

Referring to FIG. 3C, the connector 122 may have a height H1. The connector 121 may have a height H1. The connectors 121 and 122 may have the same height, H1. The height H1 may be in the Z-axis direction. The connector 131 may have a height H2. The connector 132 may have a height H2. The connectors 131 and 132 may have the same height, H2. The height H2 may be in the Z-axis direction.

The height H2 may be smaller than the height H1 so that the electronic device 14 would not be interfered by the connector 131. The height H2 may be smaller than the height H1 so that the electronic device 14 would not be physically interfered by the connector 131. The height H2 may be smaller than the height H1 so that the electronic device 14 would not be interfered by the connector 131 in communication. The height H2 may be smaller than the height H1 so that the electronic device 14 would not be connected to the connector 131. The height H2 may be smaller than the height H1 so that the electronic device 14 would not contact the connector 131. The height H2 may be smaller than the height H1 so that the electronic device 14 would not be interfered by the connector 132. The height H2 may be smaller than the height H1 so that the electronic device 14 would not be physically interfered by the connector 132. The height H2 may be smaller than the height H1 so that the electronic device 14 would not be interfered by the connector 132 in communication. The height H2 may be smaller than the height H1 so that the electronic device 14 would not be connected to the connector 132. The height H2 may be smaller than the height H1 so that the electronic device 14 would not contact the connector 132.

Figure 4:
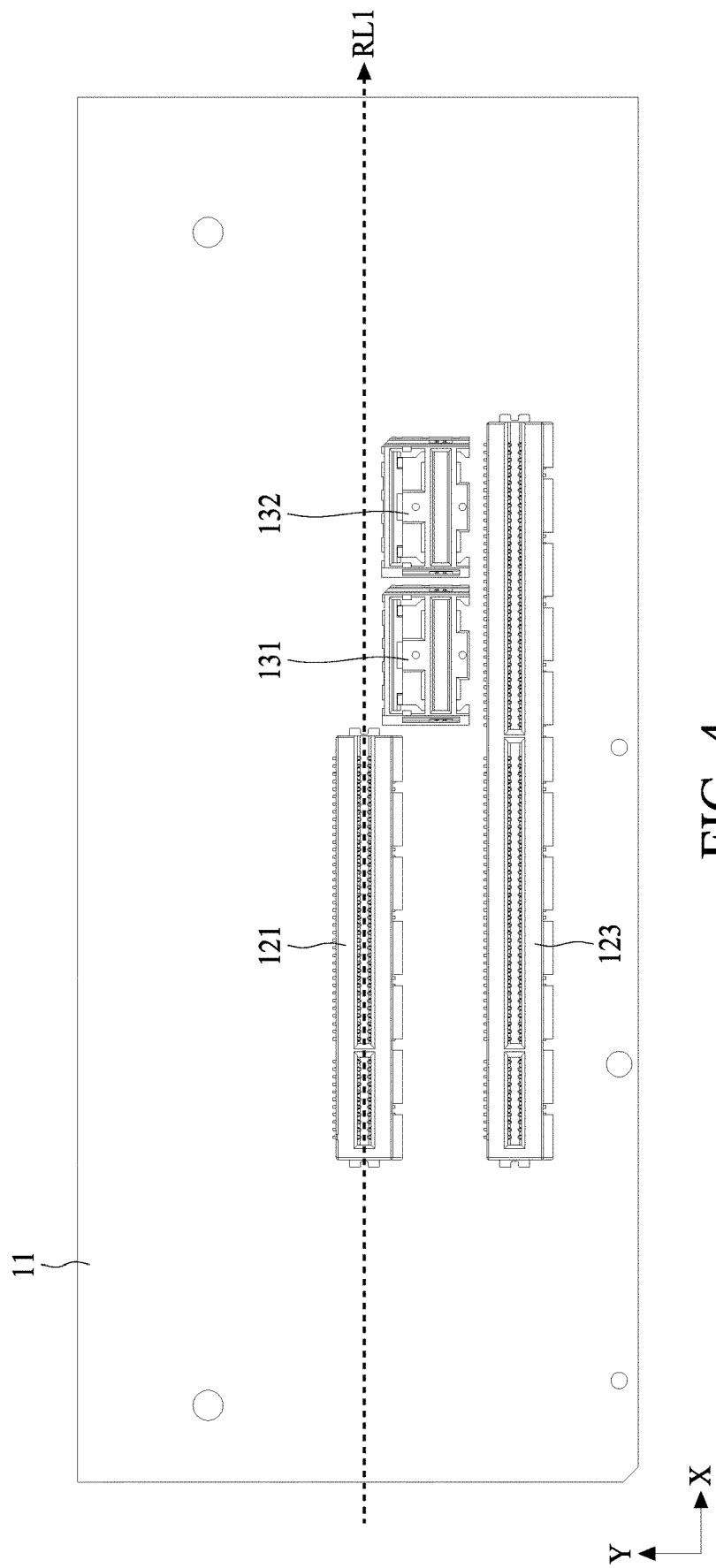
FIG. 4 is a top schematic view of an electronic device according to some embodiments of the present disclosure.

FIG. 4 illustrates an electronic device 104.

FIG. 4 is a top schematic view of an electronic device according to some embodiments of the present disclosure. FIG. 4 depicts the electronic device 104. FIG. 4 is a top schematic view of the electronic device 104. In some embodiments, the electronic device 104 may be a mainboard (or motherboard). The electronic device 104 shown in FIG. 4 is similar to the electronic device 102 shown in FIG. 2A, but differs in that the electronic device 104 may further include a connector 123. The electronic device 104 shown in FIG. 4 is similar to the electronic device 103 shown in FIG. 3A, but differs in that the electronic device 122 in FIG. 3A is replaced by the electronic device 123 in FIG. 4. The connector 123 may be disposed on the PCB 11. The connector 123 in FIG. 4 may be longer than the connector 122 in FIG. 3A.

In some embodiments, the connector 123 may be a connector compatible with PCIe standard. In some embodiments, the connector 123 may be a female connector compatible with PCIe 4.0 X8 standard. In some embodiments, the connector 123 may be a female connector compatible with PCIe 4.0 X16 standard. In some embodiments, the connector 123 may be a card-edge connector compatible with PCIe 4.0 X8 standard. In some embodiments, the connector 123 may be a card-edge connector compatible with PCIe 4.0 X16 standard. In FIG. 4, the connector 123 may be a standard connector for PCIe 4.0 X16, and the connector 121 may be a standard connector for PCIe 4.0 X8.

Referring to FIG. 4, the connectors 123 and 131 may be different. The shapes of the connectors 123 and 131 may be different. The areas of the connectors 123 and 131 may be different. The pins of the connectors 123 and 131 may be different. In some embodiments, the signals of the connectors 123 and 131 may be compatible. In some embodiments, the connector 123 may be configured to transmit the signals compatible with those transmitted on the connector 131. For example, both the connectors 123 and 131 may transmit signals compatible with any one of PCIe 1.0 to PCIe 5.0 standards.

Referring to FIG. 4, the connectors 121 and 123 may be similar. The shapes of the connectors 121 and 123 may be similar. The areas of the connectors 121 and 123 may be similar. The pins of the connectors 121 and 123 may be similar. In some embodiments, the signals of the connectors 121 and 123 may be compatible. In some embodiments, the connector 123 may be configured to transmit the signals compatible with those transmitted on the connector 121. For example, both the connectors 121 and 123 may transmit signals compatible with any one of PCIe 1.0 to PCIe 5.0 standards. In some embodiments, the connector 123 may be configured to transmit the signals compatible with those transmitted on the connector 121. For example, both the connectors 121 and 123 may transmit signals compatible with any one of PCIe 1.0 to PCIe 5.0 standards.

Referring to FIG. 4, the connector 123 may be arranged in parallel with the connector 121. The connector 123 may be arranged in parallel with the connector 121 along the X-axis direction. The connector 123 may be arranged next to the connector 121. The connector 123 may be adjacent to the connector 121. The connector 123 may be adjacent to reference line RL1. The connector 123 may have a long side parallel to reference line RL1. The connector 123 may have a short side perpendicular to reference line RL1. The distance between the reference line RL1 and the connector 123 may be approximately ranged from 10 mm to 30 mm. The distance between the reference line RL1 and the connector 123 may be preferably approximately ranged from 15 mm to 25 mm. The distance between the reference line RL1 and the connector 123 may be more preferably approximately 20.32 mm. The distance between the reference line RL1 and the slot of the connector 123 may be more preferably approximately 20.32 mm. The distance between the slot of the connector 121 and the slot of the connector 123 may be more preferably approximately 20.32 mm.

Referring to FIG. 4, the connector 123 may be adjacent to the connector 131. The connector 131 may be between the connector 123 and the reference line RL1. The connector 123 may be adjacent to the connector 132. The connector 132 may be between the connector 123 and the reference line RL1.

In some embodiments, the power supplying to the connectors 121, 123, 131, and 132 may be compatible. In some embodiments, the connector 123 may be configured to provide power compatible with that provided on the connector 121.

In some embodiments, the areas on the PCB 11 occupied by the connector 131 may be smaller than that occupied by the connector 123. The connector 123 may be a PCIe connector. The connector 131 may be a board-to-board connector. The connectors 121, 131 and 132 may form a hybrid connection structure. The connectors 121, 131 and 132 may establish a hybrid connection structure. The connectors 121, 131 and 132 may form a hybrid connection structure on the PCB 11.

Figure 5A:
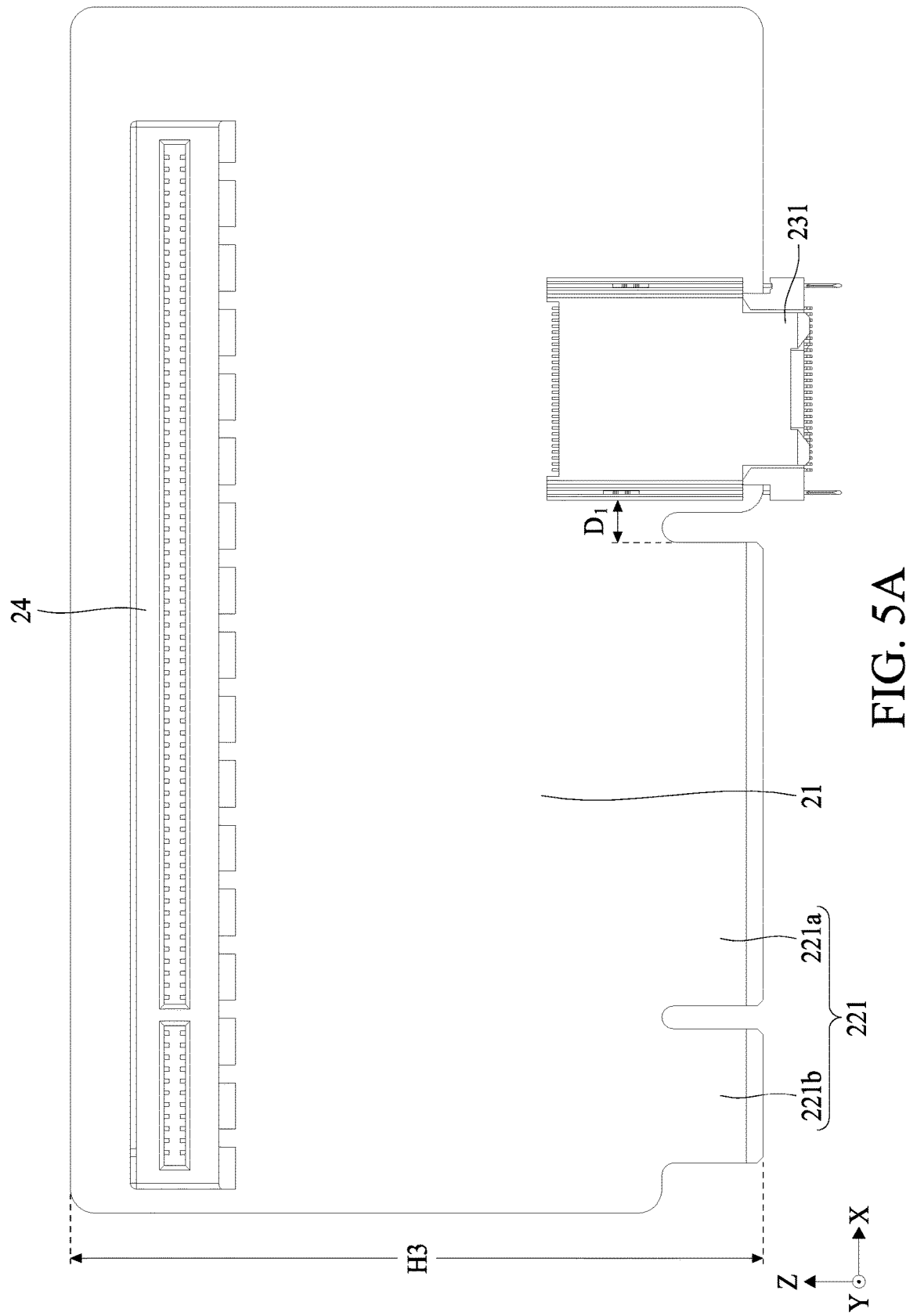
FIG. 5A is a side schematic view of an electronic device according to some embodiments of the present disclosure.
Figure 5B:
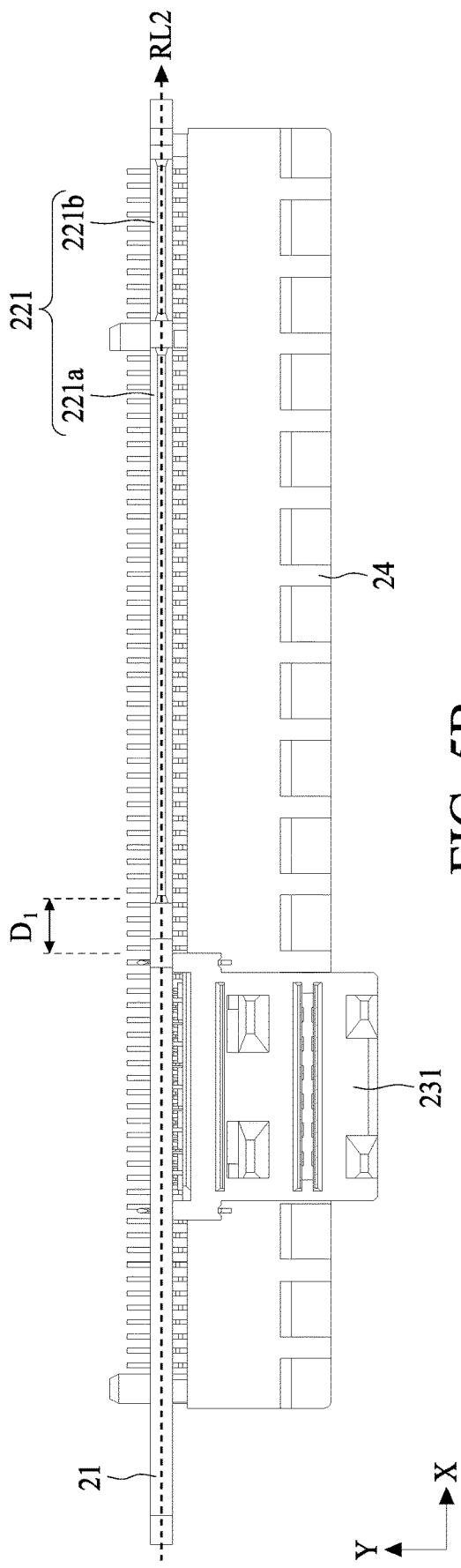
FIG. 5B is a bottom schematic view of an electronic device according to some embodiments of the present disclosure.

FIGS. 5A and 5B illustrate an electronic device 201.

FIG. 5A is a side schematic view of an electronic device according to some embodiments of the present disclosure. FIG. 5A depicts the electronic device 201. FIG. 5A is a side schematic view of the electronic device 201. The electronic device 201 may include a PCB 21, a connector 221, a connector 231, and a connector 24. In some embodiments, the electronic device 201 may have a height H3 in Z-axis direction. The height H3 may be approximately ranged from 0.5 U to 2 U. "U" is a unit for the height of computer chasses or server chasses. In some embodiments, 1 U equals to 44.45 mm. When the electronic device 201 and a main board are accommodated in a chassis, wherein the electronic device 201 is connected to the main board, the height H3 may be arranged so that total height of the electronic device 201 (i.e., H3) and the main board is smaller than the height limit of the chassis (e.g., 2 U).

In some embodiments, the connector 221 may include a plurality of card-edge golden fingers. The connector 221 may be arranged on the electronic device 201. The connector 221 may be arranged on one side of the PCB 21. The connector 221 may be arranged on one edge of the PCB 21. The connector 221 may be a standard connector compatible with any one of PCIe 1.0 to PCIe 5.0.

In some embodiments, the connector 221 may be a connector compatible with PCIe standard. In some embodiments, the connector 221 may be a male connector compatible with PCIe 4.0 X8 standard. In some embodiments, the connector 221 may be a male connector compatible with PCIe 4.0 X16 standard. In some embodiments, the connector 221 may have a plurality of card-edge golden fingers compatible with PCIe 4.0 X8 standard. In some embodiments, the connector 221 may have a plurality of card-edge golden fingers compatible with PCIe 4.0 X16 standard.

The connector 231 may be disposed on the PCB 21. The connector 231 may be disposed on a surface of the PCB 21. The connector 231 may be mounted on the PCB 21. The connector 231 may be mounted on a surface of the PCB 21.

In some embodiments, the connector 231 may be a board-to-board connector. In some embodiments, the connector 231 may be a board-to-board male connector. In some embodiments, the connector 231 may be a board-to-board female connector. In some embodiments, the connector 231 may be a board-to-board connector of IT9 series from Hirose Electric Co., LTD. In some embodiments, the connector 231 may be a board-to-board male connector of IT9 series from Hirose Electric Co., LTD. In some embodiments, the connector 231 may be a board-to-board female connector of IT9 series from Hirose Electric Co., LTD.

A plurality of card-edge golden fingers compatible with any one of PCIe 1.0 to PCIe 5.0 (e.g., the connector 221) is a standard connector widely used in the art. A board-to-board connector (e.g., the connector 231) is not a standard connector widely used in the art. A plurality of card-edge golden fingers compatible with any one of PCIe 1.0 to PCIe 5.0 cannot be replaced by a board-to-board connector. A board-to-board connector may not be solely used on a peripheral expansion card. In the field of the disclosure, a board-to-board connector was not used together with a plurality of card-edge golden fingers compatible with any one of PCIe 1.0 to PCIe 5.0 on a peripheral expansion card alone. Generally, the cost of using board-to-board connectors is more expensive than that of using PCIe connectors. The cost will increase if board-to-board connectors are used on a peripheral expansion card. In the field of the disclosure, PCIe connectors (e.g., a plurality of card-edge golden fingers) and board-to-board connector were not used together on a peripheral expansion card because of additional processes (e.g., anti-oxidation process for the peripheral expansion card). In the field of the disclosure, PCIe connectors (e.g., a plurality of card-edge golden fingers) and board-to-board connector were not used together on a peripheral expansion card because of cost.

Referring to FIG. 5A, the connectors 221 and 231 may be different. The shapes of the connectors 221 and 231 may be different. The areas of the connectors 221 and 231 may be different. The pins of the connectors 221 and 231 may be different. In some embodiments, the signals of the connectors 221 and 231 may be compatible. In some embodiments, the connector 231 may be configured to transmit the signals compatible with those transmitted on the connector 221. For example, both the connectors 221 and 231 may transmit signals compatible with any one of PCIe 1.0 to PCIe 5.0 standards.

In some embodiments, the power supplying to the connectors 221 and 231 may be compatible. In some embodiments, the connector 231 may be configured to provide power compatible with that provided on the connector 221. For example, the connectors 221 and 231 may provide power compatible with any one of PCIe 1.0 to PCIe 5.0 standards to the PCB 21. The connectors 221 and 231 may provide power compatible with any one of PCIe 1.0 to PCIe 5.0 standards to the electronic device connected to the connector 24. It should be noted that the connector 231 may be configured to transmit signals. It should be noted that the connector 231 may be configured to provide power.

The connector 221 may include portions 221a and 221b. In some embodiments, the portion 221a of the connector 221 may transmit signals. In some embodiments, the portion 221b of the connector 221 may provide power. For example, according to any one of PCIe 1.0 to PCIe 5.0 standards, the portion 221a of the connector 221 may transmit signals, and the portion 221b of the connector 221 may provide power. It should be noted that the connector 221 may be configured to transmit signals. It should be noted that the connector 221 may be configured to provide power. It should be noted that the connector 221 may transmit signals and provide power simultaneously.

Referring to FIG. 5A, the connector 231 may be close to the connector 221. The connector 231 may be adjacent to the connector 221. The distance between the connector 231 and the connector 221 may be D1. The distance D1 may be arranged so that the connector 221 and the connector 231 do not physically interfere with each other. The distance D1 may be arranged so that the connector 221 and the connector 231 do not interfere with each other in communication. The distance D1 may be approximately ranged from 1 mm to 100 mm. The distance D1 may be preferably approximately ranged from 1 mm to 50 mm. The distance D1 may be more preferably approximately ranged from 1 mm to 10 mm.

The connector 24 may be disposed on the PCB 21. The connector 24 may be disposed on a surface of the PCB 21. The connector 24 may be mounted on the PCB 21. The connector 24 may be mounted on a surface of the PCB 21. In some embodiments, the connector 24 may be a connector compatible with PCIe standard. In some embodiments, the connector 24 may be a female connector compatible with PCIe 4.0 X8 standard. In some embodiments, the connector 24 may be a female connector compatible with PCIe 4.0 X16 standard. In some embodiments, the connector 24 may be a card-edge connector compatible with PCIe 4.0 X8 standard. In some embodiments, the connector 24 may be a card-edge connector compatible with PCIe 4.0 X16 standard.

Referring to FIG. 5A, the connectors 221, 231 and 24 may be mounted on the PCB 21. The connectors 221, 231 and 24 may be integrated on the PCB 21. The connectors 231 and 24 may be disposed on the same side of the electronic device 201. The connectors 231 and 24 may be disposed on the same side of the PCB 21. The connectors 231 and 24 may be disposed on the same surface of the PCB 21. The connectors 231 and 24 may be disposed on different sides of the electronic device 201. The connectors 231 and 24 may be disposed on different sides of the PCB 21. The connectors 231 and 24 may be disposed on different surfaces of the PCB 21. The connectors 231 and 24 may be disposed on opposite surfaces of the PCB 21.

The orientation of the connector 221 may be the same as that of the connector 231. In some embodiments, the orientation of the connector 221 may be in the negative Z-axis direction. In some embodiments, the orientation of the connector 231 may be in the negative Z-axis direction. In some embodiments, the orientation of the connector 24 may be in the Y-axis direction. The orientation of the connector 221 may be perpendicular to the orientation of the connector 24. The orientation of the connector 231 may be perpendicular to the orientation of the connector 24.

FIG. 5B is a bottom schematic view of an electronic device according to some embodiments of the present disclosure. FIG. 5B depicts the electronic device 201. FIG. 5B is a bottom schematic view of the electronic device 201.

FIGS. 5A and 5B depict the electronic device 201. FIG. 5B further shows a reference line RL2. It should be noted that the reference line RL2 is a virtual line. It should be noted that the reference line RL2 is a virtual line for locating the positions of the components (e.g., including, but not limited to, connectors 221 and 231). It should be noted that the reference line RL2 is a virtual line for locating the positions of the components (e.g., including, but not limited to, connectors 221 and 231) disposed on the PCB 21. It should be noted that the reference line RL2 is a virtual line for locating the relative positions of the components (e.g., including, but not limited to, connectors 221 and 231) disposed on the PCB 21. The reference line RL2 may be in parallel with the X-axis. The reference line RL2 may extend along the central line of the connector 221, in which the central line of the connector 221 may be parallel to the X-axis. The reference line RL2 may overlap the central line of the connector 221, in which the central line of the connector 221 may be parallel to the X-axis.

In some embodiments, the electronic device 201 may be connected to, but not limited to, the electronic device 101 in FIG. 1. In some embodiments, the electronic device 201 may be connected to, but not limited to, the electronic device 102 in FIG. 2A. In some embodiments, the electronic device 201 may be connected to, but not limited to, the electronic device 103 in FIG. 3A. In some embodiments, the electronic device 201 may be connected to, but not limited to, the electronic device 104 in FIG. 4. When the electronic device 201 is connected to any one of the electronic devices 101, 102, 103 and 104, the reference line RL2 shown in FIG. 5B may overlap the reference line RL1 shown in corresponding one of FIGS. 1, 2A, 3A and 4.

Referring to FIGS. 5A and 5B, the connector 221 may be a PCIe connector. The connector 231 may be a board-to-board connector. The connectors 221 and 231 may form a hybrid connection structure. The connectors 221 and 231 may establish a hybrid connection structure. The connectors 221 and 231 may form a hybrid connection structure on the PCB 21. The connector 231 would not interfere with the connector 221. The connector 231 would not physically interfere with the connector 221. The connector 231 would not interfere with the connection of the connector 221. The connector 231 would not physically interfere with the connection of the connector 221. The connector 231 would not interfere with the connector 24. The connector 231 would not physically interfere with the connector 24. The connector 231 would not interfere with the connection of the connector 24. The connector 231 would not physically interfere with the connection of the connector 24.

Figure 6:
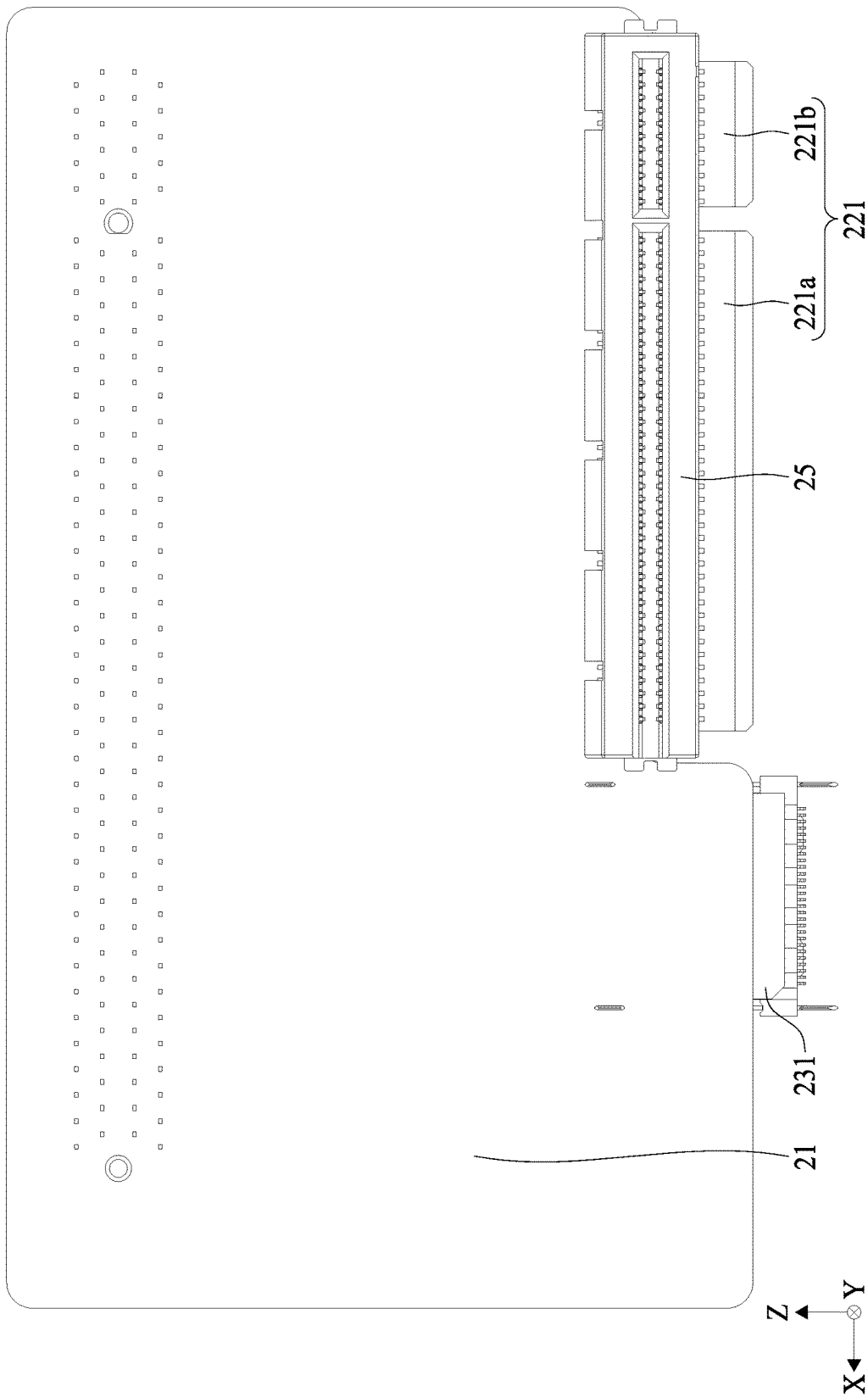
FIG. 6 is a side schematic view of an electronic device according to some embodiments of the present disclosure.

FIG. 6 is a side schematic view of an electronic device according to some embodiments of the present disclosure. FIG. 6 depicts an electronic device 202. FIG. 6 is a side schematic view of the electronic device 202. The electronic device 202 shown in FIG. 6 is similar to the electronic device 201 shown in FIG. 5A, but differs in that the electronic device 202 may further include a connector 25. The electronic device 202 shown in FIG. 6 is similar to the electronic device 201 shown in FIG. 5B, but differs in that the electronic device 202 may further include a connector 25.

The connector 25 may be disposed on the PCB 21. The connector 25 may be disposed on a surface of the PCB 21. The connector 25 may be mounted on the PCB 21. The connector 25 may be mounted on a surface of the PCB 21. In some embodiments, the connector 25 may be a connector compatible with PCIe standard. In some embodiments, the connector 25 may be a female connector compatible with PCIe 4.0 X8 standard. In some embodiments, the connector 25 may be a female connector compatible with PCIe 4.0 X16 standard. In some embodiments, the connector 25 may be a card-edge connector compatible with PCIe 4.0 X8 standard. In some embodiments, the connector 25 may be a card-edge connector compatible with PCIe 4.0 X16 standard.

Referring to FIG. 6, the connectors 221, 231 and 25 may be mounted on the PCB 21. The connectors 221, 231 and 25 may be integrated on the PCB 21. The connectors 231 and 25 may be disposed on different sides of the electronic device 201. The connector 231 and 25 may be disposed on different sides of the PCB 21. The connector 231 and 25 may be disposed on different surfaces of the PCB 21. The connector 231 and 25 may be disposed on opposite surfaces of the PCB 21. The connectors 231 and 25 may be disposed on the same side of the electronic device 202. The connector 231 and 25 may be disposed on the same side of the PCB 21. The connector 231 and 25 may be disposed on the same surface of the PCB 21.

In some embodiments, the orientation of the connector 25 may be in the negative Y-axis direction. The orientation of the connector 221 may be perpendicular to the orientation of the connector 25. The orientation of the connector 231 may be perpendicular to the orientation of the connector 25.

Referring to FIG. 6, the connector 221 may be a PCIe connector. The connector 231 may be a board-to-board connector. The connectors 221 and 231 may form a hybrid connection structure. The connectors 221 and 231 may establish a hybrid connection structure. The connectors 221 and 231 may form a hybrid connection structure on the PCB 21. The connector 231 would not interfere with the connector 221. The connector 231 would not physically interfere with the connector 221. The connector 231 would not interfere with the connection of the connector 221. The connector 231 would not physically interfere with the connection of the connector 221. The connector 231 would not interfere with the connector 25. The connector 231 would not physically interfere with the connector 25. The connector 231 would not interfere with the connection of the connector 25. The connector 231 would not physically interfere with the connection of the connector 25.

Figure 7A:
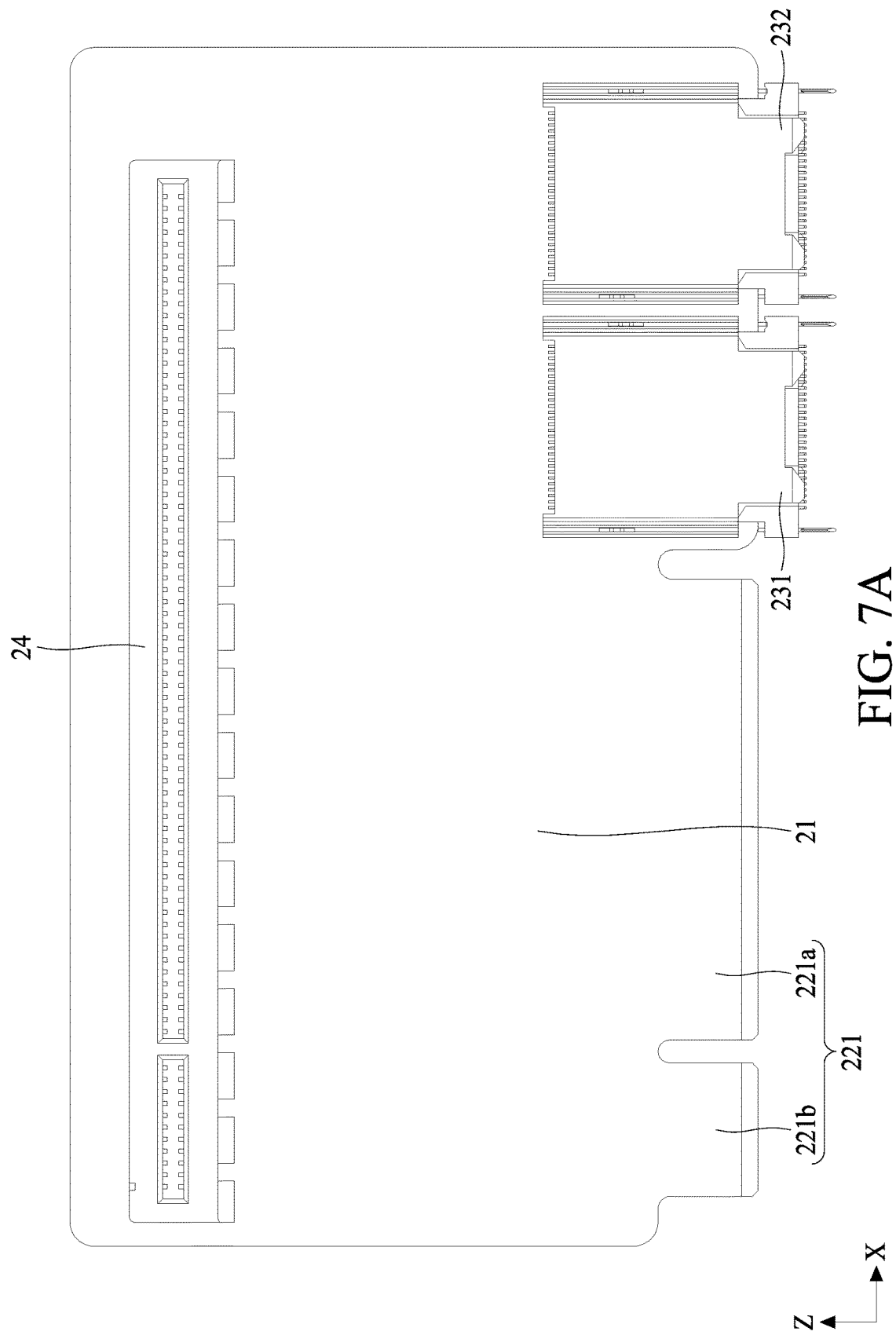
FIG. 7A is a side schematic view of an electronic device according to some embodiments of the present disclosure.
Figure 7B:
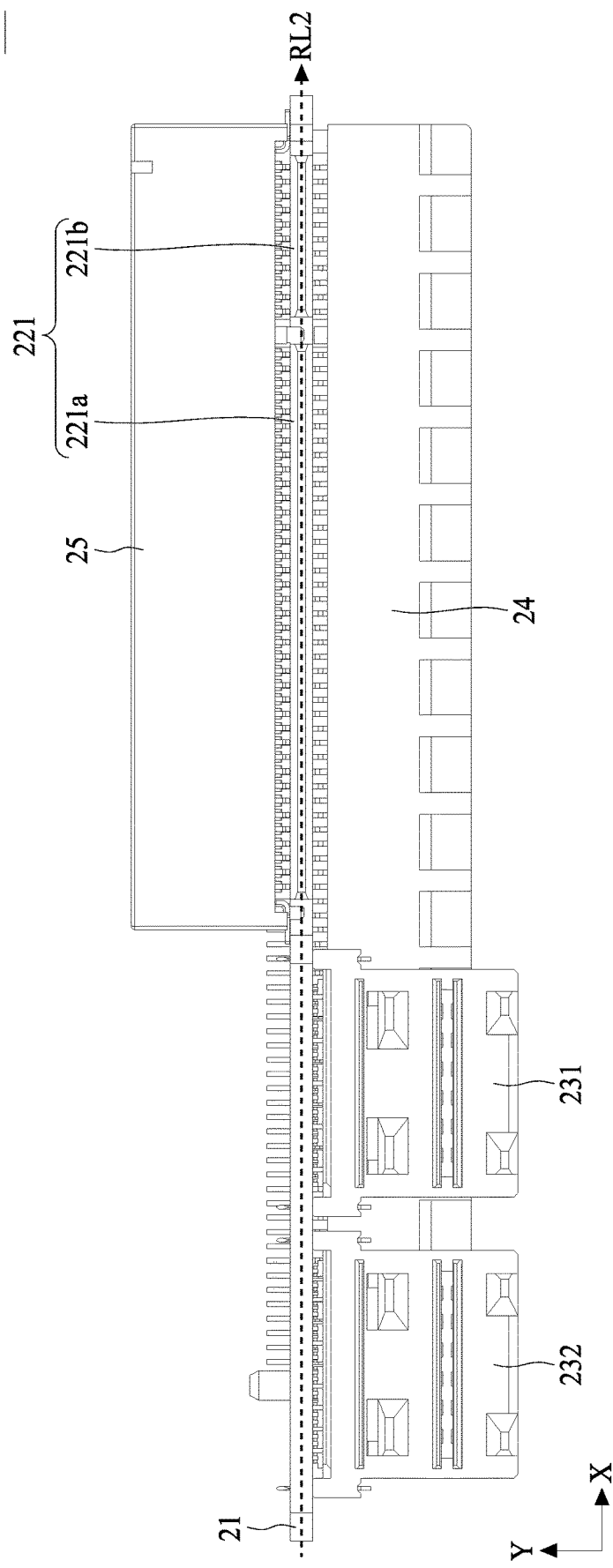
FIG. 7B is a bottom schematic view of an electronic device according to some embodiments of the present disclosure.

FIGS. 7A and 7B illustrate an electronic device 203.

FIG. 7A is a side schematic view of an electronic device according to some embodiments of the present disclosure. FIG. 7A depicts the electronic device 203. FIG. 7A is a side schematic view of the electronic device 203. The electronic device 203 shown in FIG. 7A is similar to the electronic device 202 shown in FIG. 6, but differs in that the electronic device 203 may further include a connector 232.

The connector 232 may be disposed on the PCB 21. The connector 232 may be disposed on a surface of the PCB 21. The connector 232 may be mounted on the PCB 21. The connector 232 may be mounted on a surface of the PCB 21.

In some embodiments, the connector 232 may be a board-to-board connector. In some embodiments, the connector 232 may be a board-to-board male connector. In some embodiments, the connector 232 may be a board-to-board female connector. In some embodiments, the connector 232 may be a board-to-board connector of IT9 series from Hirose Electric Co., LTD. In some embodiments, the connector 232 may be a board-to-board male connector of IT9 series from Hirose Electric Co., LTD. In some embodiments, the connector 232 may be a board-to-board female connector of IT9 series from Hirose Electric Co., LTD.

Referring to FIG. 7A, the connectors 221 and 232 may be different. The shapes of the connectors 221 and 232 may be different. The areas of the connectors 221 and 232 may be different. The pins of the connectors 221 and 232 may be different. In some embodiments, the signals of the connectors 221 and 232 may be compatible. In some embodiments, the connector 232 may be configured to transmit the signals compatible with those transmitted on the connector 221. For example, both the connectors 221 and 232 may transmit signals compatible with any one of PCIe 1.0 to PCIe 5.0 standards.

In some embodiments, the power supplying to the connectors 221 and 232 may be compatible. In some embodiments, the connector 232 may be configured to provide power compatible with that provided on the connector 221. For example, the connectors 221 and 232 may provide power compatible with any one of PCIe 1.0 to PCIe 5.0 standards to the PCB 21. The connectors 221 and 232 may provide power compatible with any one of PCIe 1.0 to PCIe 5.0 standards to the electronic devices connected to the connector 24. The connectors 221 and 232 may provide power compatible with any one of PCIe 1.0 to PCIe 5.0 standards to the electronic devices connected to the connector 25. It should be noted that the connector 232 may be configured to transmit signals. It should be noted that the connector 232 may be configured to provide power.

Referring to FIG. 7A, the connectors 231 and 232 may be identical. The shapes of the connectors 231 and 232 may be identical. The areas of the connectors 231 and 232 may be identical. The pins of the connectors 231 and 232 may be identical. In some embodiments, the signals of the connectors 231 and 232 may be compatible.

Referring to FIG. 7A, the connector 232 may be arranged in parallel with the connector 231. The connector 232 may be arranged next to the connector 231. The connector 232 may be adjacent to the connector 231. The connectors 231 and 232 may be arranged side by side.

FIG. 7B is a bottom schematic view of an electronic device according to some embodiments of the present disclosure. FIG. 7B depicts the electronic device 203. FIG. 7B is a bottom schematic view of the electronic device 203.

FIGS. 7A and 7B depict the electronic device 203. FIG. 7B further shows a reference line RL2. It should be noted that the reference line RL2 is a virtual line. It should be noted that the reference line RL2 is a virtual line for locating the positions of the components (e.g., including, but not limited to, connectors 221 and 232). It should be noted that the reference line RL2 is a virtual line for locating the positions of the components (e.g., including, but not limited to, connectors 221 and 232) disposed on the PCB 21. It should be noted that the reference line RL2 is a virtual line for locating the relative positions of the components (e.g., including, but not limited to, connectors 221 and 232) disposed on the PCB 21. The reference line RL2 may be in parallel with the X-axis. The reference line RL2 may extend along the central line of the connector 221, in which the central line of the connector 221 may be parallel to the X-axis. The reference line RL2 may overlap the central line of the connector 221, in which the central line of the connector 221 may be parallel to the X-axis. When the electronic device 203 is connected to any one of the electronic devices 101, 102, 103 and 104, the reference line RL2 shown in FIG. 7B may overlap the reference line RL1 shown in corresponding one of FIGS. 1, 2A, 3A and 4.

FIG. 7B shows that the electronic device 203 may further include a connector 25. The connector 25 may be disposed on the PCB 21. The connector 25 may be disposed on a surface of the PCB 21. The connector 25 may be mounted on the PCB 21. The connector 25 may be mounted on a surface of the PCB 21. In some embodiments, the connector 25 may be a connector compatible with PCIe standard. In some embodiments, the connector 25 may be a female connector compatible with PCIe 4.0 X8 standard. In some embodiments, the connector 25 may be a female connector compatible with PCIe 4.0 X16 standard. In some embodiments, the connector 25 may be a card-edge connector compatible with PCIe 4.0 X8 standard. In some embodiments, the connector 25 may be a card-edge connector compatible with PCIe 4.0 X16 standard.

The connectors 221, 231, 232, 24 and 25 may be mounted on the PCB 21. The connectors 221, 231, 232, 24 and 25 may be integrated on the PCB 21. The connectors 231 and 25 may be disposed on different sides of the electronic device 203. The connector 231 and 25 may be disposed on different sides of the PCB 21. The connector 231 and 25 may be disposed on different surfaces of the PCB 21. The connector 231 and 25 may be disposed on opposite surfaces of the PCB 21. The connectors 231 and 25 may be disposed on the same side of the electronic device 203. The connector 231 and 25 may be disposed on the same side of the PCB 21. The connector 231 and 25 may be disposed on the same surface of the PCB 21.

In some embodiments, the orientation of the connector 25 may be in the Y-axis direction. The orientation of the connector 221 may be perpendicular to the orientation of the connector 25. The orientation of the connector 231 may be perpendicular to the orientation of the connector 25. The orientation of the connector 232 may be perpendicular to the orientation of the connector 25.

Referring to FIGS. 7A and 7B, the connector 221 may be a PCIe connector. The connector 231 may be a board-to-board connector. The connector 232 may be a board-to-board connector. The connectors 221, 231 and 232 may form a hybrid connection structure. The connectors 221, 231 and 232 may establish a hybrid connection structure. The connectors 221, 231 and 232 may form a hybrid connection structure on the PCB 21. The connector 231 would not interfere with the connector 221. The connector 231 would not physically interfere with the connector 221. The connector 231 would not interfere with the connection of the connector 221. The connector 231 would not physically interfere with the connection of the connector 221. The connector 231 would not interfere with the connector 25. The connector 231 would not physically interfere with the connector 25. The connector 231 would not interfere with the connection of the connector 25. The connector 231 would not physically interfere with the connection of the connector 25. The connector 232 would not interfere with the connector 221. The connector 232 would not physically interfere with the connector 221. The connector 232 would not interfere with the connection of the connector 221. The connector 232 would not interfere with the connector 25. The connector 232 would not physically interfere with the connector 25. The connector 232 would not interfere with the connection of the connector 25. The connector 232 would not physically interfere with the connection of the connector 25.

Figure 8:
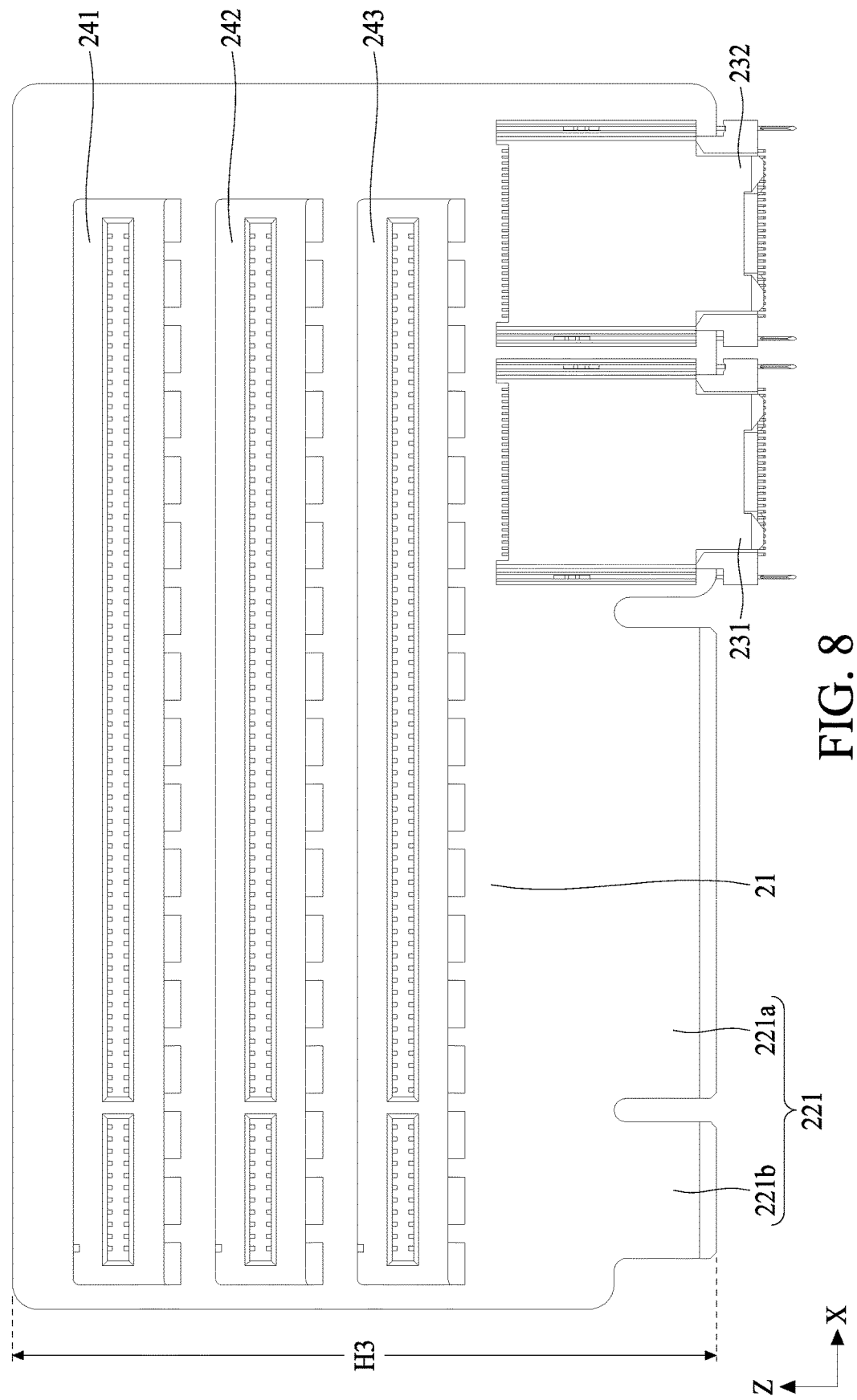
FIG. 8 is a side schematic view of an electronic device according to some embodiments of the present disclosure.

FIG. 8 illustrates an electronic device 204. FIG. 8 is a side schematic view of an electronic device according to some embodiments of the present disclosure. FIG. 8 depicts the electronic device 204. FIG. 8 is a side schematic view of the electronic device 204. The electronic device 204 shown in FIG. 8 is similar to the electronic device 203 shown in FIGS. 7A and 7B, but differs in that the electronic device 204 may include connectors 241, 242, and 243 instead of the connectors 24 and 25.

The connectors 241, 242, and 243 may be disposed on the PCB 21. The connectors 241, 242, and 243 may be disposed on a surface of the PCB 21. The connectors 241, 242, and 243 may be mounted on the PCB 21. The connectors 241, 242, and 243 may be mounted on a surface of the PCB 21. In some embodiments, the connectors 241, 242, and 243 may be connectors compatible with PCIe standard. In some embodiments, the connectors 241, 242, and 243 may be female connectors compatible with PCIe 4.0 X8 standard. In some embodiments, the connectors 241, 242, and 243 may be female connectors compatible with PCIe 4.0 X16 standard. In some embodiments, the connectors 241, 242, and 243 may be card-edge connectors compatible with PCIe 4.0 X8 standard. In some embodiments, the connectors 241, 242, and 243 may be card-edge connectors compatible with PCIe 4.0 X16 standard.

Referring to FIG. 8, the connectors 241, 242, and 243 may be arranged in parallel among one another. The connectors 241, 242, and 243 may be adjacent to one another. The connectors 241, 242, and 243 may be arranged side by side.

Referring to FIG. 8, the connectors 221, 231, 232, 241, 242, and 243 may be mounted on the PCB 21. The connectors 221, 231, 232, 241, 242, and 243 may be integrated on the PCB 21. The connectors 231, 232, 241, 242, and 243 may be disposed on the same side of the electronic device 201. The connectors 231, 232, 241, 242, and 243 may be disposed on the same side of the PCB 21. The connectors 231, 232, 241, 242, and 243 may be disposed on the same surface of the PCB 21.

The connectors 231 and 232 may be disposed on one side of the electronic device 201, and the connectors 241, 242, and 243 may be disposed on the other side of electronic device 201. The connectors 231 and 232 may be disposed on one side of the PCB 21, and the connectors 241, 242, and 243 may be disposed on the other side of PCB 21. The connectors 231 and 232 may be disposed on one surface of the PCB 21, and the connectors 241, 242, and 243 may be disposed on the other surface of PCB 21.

In some embodiments, a set of connectors 241, 242, and 243 may be disposed on one side of the electronic device 201, and another set of connectors 241, 242, and 243 may be disposed on the other side of electronic device 201. A set of connectors 241, 242, and 243 may be disposed on one side of the PCB 21, and another set of connectors 241, 242, and 243 may be disposed on the other side of PCB 21. A set of connectors 241, 242, and 243 may be disposed on one surface of the PCB 21, and another set of connectors 241, 242, and 243 may be disposed on the other surface of PCB 21. In some embodiments, there may be six PCIe connectors (two sets of connectors 241, 242, and 243) disposed on the electronic device 201. There may be six PCIe connectors (two sets of connectors 241, 242, and 243) disposed on the PCB 21.

In some embodiments, the orientation of the connectors 241, 242, and 243 may be in the Y-axis direction. The orientation of the connector 221 may be perpendicular to the orientation of the connectors 241, 242, and 243. The orientation of the connector 231 may be perpendicular to the orientation of the connectors 241, 242, and 243. The orientation of the connector 232 may be perpendicular to the orientation of the connectors 241, 242, and 243.

The connector 231 would not interfere with any one of the connectors 241, 242, and 243. The connector 231 would not physically interfere with any one of the connectors 241, 242, and 243. The connector 231 would not interfere with the connection of any one of the connectors 241, 242, and 243. The connector 231 would not physically interfere with the connection of any one of the connectors 241, 242, and 243. The connector 232 would not interfere with any one of the connectors 241, 242, and 243. The connector 232 would not physically interfere with any one of the connectors 241, 242, and 243. The connector 232 would not interfere with the connection of any one of the connectors 241, 242, and 243. The connector 232 would not physically interfere with the connection of any one of the connectors 241, 242, and 243.

In some embodiments, the connectors 221, 231, and 232 may provide power compatible with any one of PCIe 1.0 to PCIe 5.0 standards to the PCB 21. The connectors 221, 231, and 232 may provide power compatible with any one of PCIe 1.0 to PCIe 5.0 standards to the electronic devices connected to the connectors 241, 242, and 243.

In some embodiments, the electronic device 204 may have a height H3 in Z-axis direction. The height H3 may be approximately ranged from 0.5 U to 2 U. "U" is a unit for the height of computer chasses or server chasses. In some embodiments, 1 U equals to 44.45 mm. When the electronic device 204 and a main board are accommodated in a chassis, wherein the electronic device 204 is connected to the main board, the height H3 may be arranged so that total height of the electronic device 204 (i.e., H3) and the main board is smaller than the height limit of a chassis (e.g., 2 U).

Figure 9:
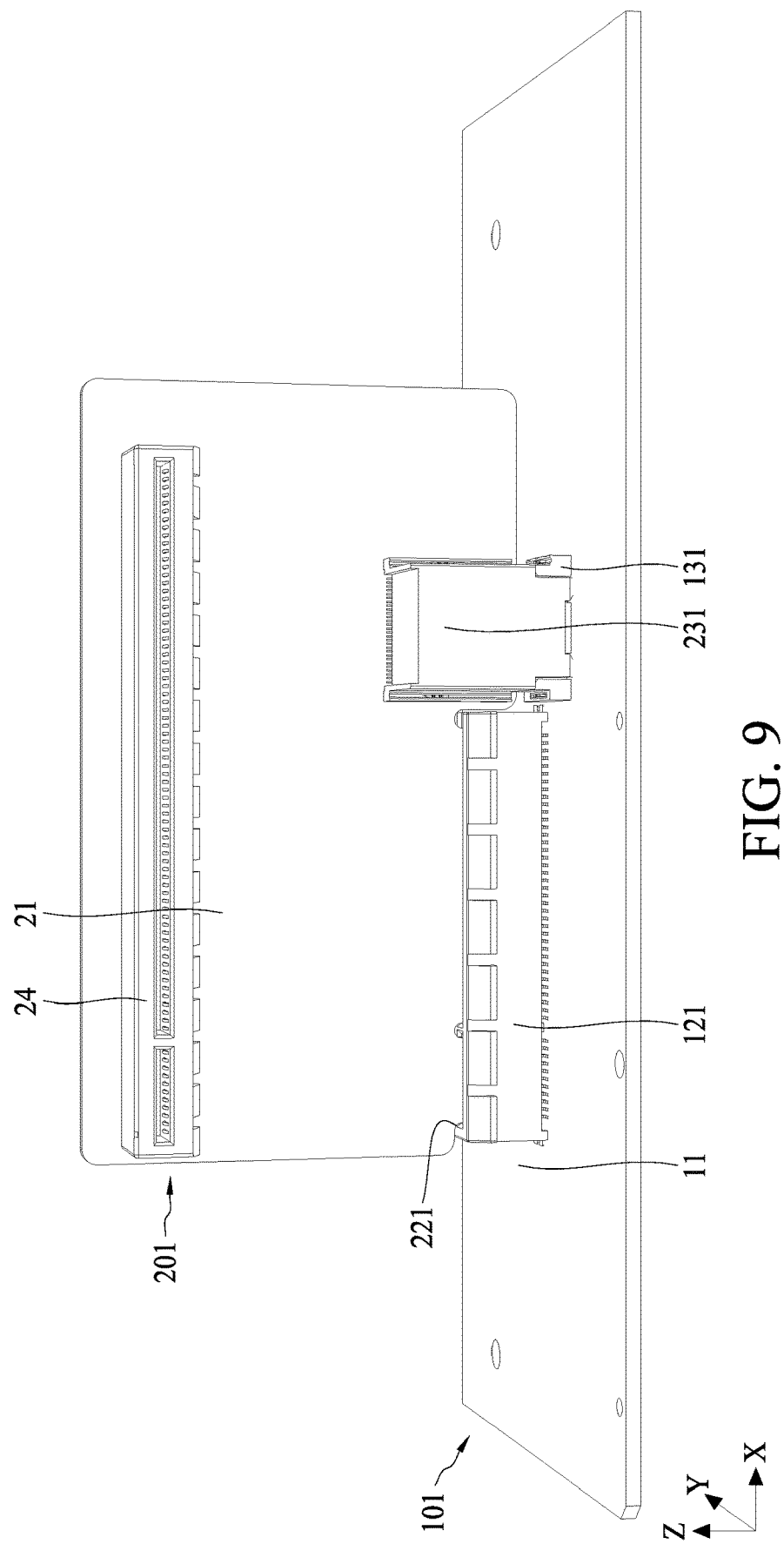
FIG. 9 is a 3D schematic view of electronic devices according to some embodiments of the present disclosure.

FIG. 9 is a 3D schematic view of electronic devices according to some embodiments of the present disclosure. FIG. 9 depicts an electronic device 101 and an electronic device 201. FIG. 9 depicts an electronic device 101 as shown in FIG. 1. FIG. 9 depicts an electronic device 201 as shown in FIGS. 5A and 5B. FIG. 9 depicts a connection between two electronic devices. FIG. 9 depicts a connection between the electronic devices 101 and 201.

The electronic device 201 may be connected to the electronic device 101. The PCB 21 may be connected to the PCB 11. The electronic device 201 may be connected to the electronic device 101 by coupling the connector 221 with the connector 121 and coupling the connector 231 with the connector 131. The electronic device 201 may be connected to the electronic device 101 in communication through the connection between the connectors 221 and 121. The electronic device 201 may be connected to the electronic device 101 in communication through the connection between the connectors 231 and 131. The electronic device 201 may be connected to the electronic device 101 in communication through the connection between the connectors 221 and 121 and the connection between the connectors 231 and 131.

In some embodiments of FIG. 9, the bandwidths provided by the connectors 121 and 131 may be coupled together, and the connector 24 may provide the bandwidths of the connectors 121 and 131. In some embodiments of FIG. 9, the connector 24 may provide the bandwidth of the connector 121 or 131. In some embodiments of FIG. 9, the connector 121 may provide a bandwidth of PCIe 4.0 X8, the connector 131 may provide a bandwidth of PCIe 4.0 X8, and the connector 24 may provide a bandwidth of PCIe 4.0 X8 or PCIe 4.0 X16.

Referring to FIG. 9, the orientation of the connector 121 may be in the positive Z-axis direction. The orientation of the connector 131 may be in the positive Z-axis direction. The orientation of the connector 221 may be in the negative Z-axis direction. The orientation of the connector 231 may be in the negative Z-axis direction. The orientation of the connector 24 may be in the negative Y-axis direction. The orientation of the connector 121 may be perpendicular to the orientation of the connector 24. The orientation of the connector 131 may be perpendicular to the orientation of the connector 24. The orientation of the connector 221 may be perpendicular to the orientation of the connector 24. The orientation of the connector 231 may be perpendicular to the orientation of the connector 24.

The connectors 121 and 131 may form a hybrid connection structure. The connectors 121 and 131 may establish a hybrid connection structure. The connectors 121 and 131 may form a hybrid connection structure on the PCB 11. The connectors 221 and 231 may form a hybrid connection structure. The connectors 221 and 231 may establish a hybrid connection structure. The connectors 221 and 231 may form a hybrid connection structure on the PCB 21.

Figure 10:
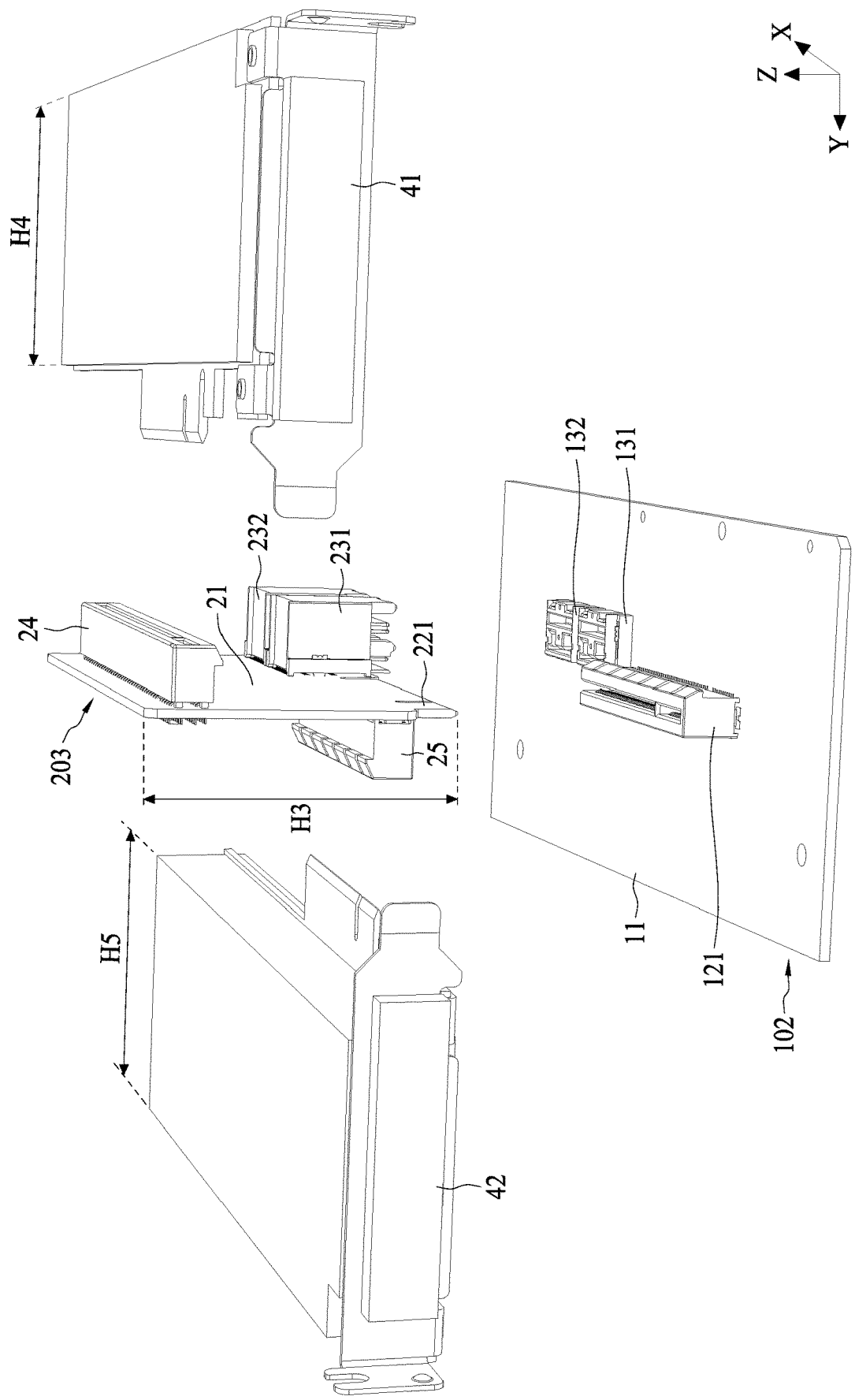
FIG. 10 is an exploded schematic view of electronic devices according to some embodiments of the present disclosure.

FIG. 10 is an exploded schematic view of electronic devices according to some embodiments of the present disclosure. FIG. 10 depicts electronic devices 102, 203, 41, and 42. The electronic device 203 may be connected to the electronic device 102. The electronic device 203 may be connected to the electronic device 102 by coupling the connector 221 with the connector 121. The electronic device 203 may be connected to the electronic device 102 by coupling the connector 231 with the connector 131. The electronic device 203 may be connected to the electronic device 102 by coupling the connector 232 with the connector 132. The electronic device 203 may be connected to the electronic device 102 in communication through the connection between the connectors 221 and 121. The electronic device 203 may be connected to the electronic device 102 in communication through the connection between the connectors 231 and 131. The electronic device 203 may be connected to the electronic device 102 in communication through the connection between the connectors 232 and 132. The electronic device 203 may be connected to the electronic device 102 in communication through the connection between the connectors 221 and 121, the connection between the connectors 231 and 131 and the connection between the connectors 232 and 133.

Referring to FIG. 10, the connectors 121 and 131 would not interfere with each other. The connectors 121 and 132 would not interfere with each other. The connectors 131 and 132 would not interfere with each other. It should be noted that the electronic device 203 may be connected to, for example, the electronic device 101 shown in FIG. 1. It should be noted that the electronic device 203 may be connected to, for example, the electronic device 103 shown in FIGS. 3A, 3B and 3C. It should be noted that the electronic device 203 may be connected to, for example, the electronic device 104 shown in FIG. 4.

Referring to FIG. 10, the connectors 221 and 231 would not interfere with each other. The connectors 221 and 232 would not interfere with each other. The connectors 231 and 232 would not interfere with each other. It should be noted that the electronic device 102 may be connected to, for example, the electronic device 201 shown in FIGS. 5A and 5B. It should be noted that the electronic device 102 may be connected to, for example, the electronic device 202 shown in FIG. 6. It should be noted that the electronic device 102 may be connected to, for example, the electronic device 204 shown in FIG. 8.

Referring to FIG. 10, the electronic device 41 may be a peripheral expansion card. The electronic device 41 may be connected to the electronic device 203. The electronic device 41 may be connected to the electronic device 203 through the connector 24. The connector 24 may be disposed on the PCB 21. The connector 24 and the connector 231 may be on the same surface of the PCB 21. The connector 24 and the connector 232 may be on the same surface of the PCB 21. The connectors 24 and 231 would not interfere with each other. The connectors 24 and 232 would not interfere with each other. The electronic device 41 and the connector 231 would not interfere with each other. The electronic device 41 and the connector 232 would not interfere with each other.

Referring to FIG. 10, the electronic device 42 may be a peripheral expansion card. The electronic device 42 may be connected to the electronic device 203. The electronic device 42 may be connected to the electronic device 203 through the connector 25. The connector 25 may be disposed on the PCB 21. The connector 25 and the connector 231 may be on opposite surfaces of the PCB 21. The connector 25 and the connector 232 may be on opposite surface of the PCB 21. The connectors 25 and 231 would not interfere with each other. The connectors 25 and 232 would not interfere with each other. The electronic device 42 and the connector 231 would not interfere with each other. The electronic device 42 and the connector 232 would not interfere with each other.

In some embodiments of FIG. 10, through the electronic device 203, one PCIe connector (for example: connector 121) may be expanded to two connectors (for example: connectors 24 and 25). Through the electronic device 203, two connectors (for example: connectors 24 and 25) may be used to connect peripheral expansion cards to the electronic device 102.

When the electronic devices 102, 203, 41, and 42 are connected together, the plane of the electronic device 41, the plane of the electronic device 42, and the plane of the electronic device 102 (i.e., the plane of the PCB 11) may be arranged in parallel. When the electronic devices 102, 203, 41, and 42 are connected together, the plane of the electronic device 41, the plane of the electronic device 42, and the plane of the electronic device 102 (i.e., the plane of the PCB 11) may be perpendicular to the plane of the electronic device 203 (i.e., the plane of the PCB 21).

Typically, a chassis is designed to accommodate peripheral expansion cards with a height no greater than 1 U. In some embodiments of FIG. 10, a chassis receiving the electronic device 102 is typically designed to accommodate peripheral expansion cards of a height no greater than 1 U (in the Z-axis direction), and the connector 121 of the electronic device 102 may only be used to connect peripheral expansion cards of a height no greater than 1 U (in the Z-axis direction). The electronic device 203 may have a height H3 (in the Z-axis direction). The height H3 may be approximately ranged from 0.5 U to 2 U. In some embodiments, 1 U equals to 44.45 mm. When the electronic device 203 and the electronic device 102 are accommodated in a chassis, wherein the electronic device 203 is connected to the electronic device 102, the height H3 may be arranged so that total height of the electronic device 203 (i.e., H3) and the electronic device 102 is smaller than the height limit of a chassis (e.g., 2 U). Through the electronic device 203, the electronic device 41 may have a height H4 greater than 1 U. Through the electronic device 203, the electronic device 42 may have a height H5 greater than 1 U.

Spatial descriptions, such as "above," "below," "up," "left," "right," "down," "top," "bottom," "vertical," "horizontal," "perpendicular," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

As used herein, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be "substantially" the same if a difference in the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

What is claimed is:

1. An electronic device, comprising:
   a circuit board;
   a first connector; and
   a second connector,
   wherein:
   the first connector and the second connector are disposed on the circuit board, the first connector is different from the second connector, the second connector is adjacent to the first connector, the first connector is arranged along a reference line, the second connector is adjacent to the reference line, and the reference line is in the first direction, and both of the first connector and the second connector connect with a second electronic device, a first bandwidth is provided to the second electronic device via the first connector, and a second bandwidth is provided to the second electronic device via the second connector.

2. The electronic device of claim 1, wherein the first connector comprises a first portion, the first portion is configured to transmit a first signal.

3. The electronic device of claim 2, wherein the second connector is configured to transmit a second signal.

4. The electronic device of claim 2, wherein the first connector includes a second portion, the second portion is configured to provide power from the circuit board.

5. The electronic device of claim 3, wherein the first signal and the second signal are compatible.

6. The electronic device of claim 1, wherein the first connector includes a first side and a second side, the first side and the first direction are parallel, and the second side is perpendicular to the first direction, and wherein the second connector includes a third side and a fourth side, the third side is perpendicular to the first direction, and the fourth side and the first direction are parallel.

7. The electronic device of claim 6, wherein the second side is adjacent to the third side.

8. The electronic device of claim 7, wherein the distance between the second side and the third side is approximately 1 mm to 50 mm.

9. The electronic device of claim 6, wherein the fourth side is adjacent to the reference line.

10. The electronic device of claim 9, wherein the distance between the fourth side and the reference line is approximately 1 mm to 3 mm.

11. The electronic device of claim 1, wherein the height of the first connector is greater than the height of the second connector such that a third electronic device is not in contact with the second connector when the first connector and the third electronic device are connected.

12. The electronic device of claim 1, further comprising:
a third connector adjacent to the second connector,
wherein the third connector and the second connector are the same, and
wherein the third connector and the second connector are arranged in parallel.

13. The electronic device of claim 1, further comprising:
a fourth connector,
wherein the fourth connector and the first connector are identical,
wherein the fourth and the first connector are arranged in parallel, and
wherein the second connector is disposed between the reference line and the fourth connector.

14. An electronic device, comprising:
a circuit board;
a first connector;
a second connector; and
a third connector,
wherein:
the first connector and the second connector are different,
the first connector is arranged along a reference line, the second connector is adjacent to the reference line, and the reference line is in the first direction, and
an orientation of the third connector is perpendicular to an orientation of the first connector, and the orientation of the third connector is perpendicular to an orientation of the second connector, and
both of the first connector and the second connector connects with a second electronic device, a first bandwidth is provided from the second electronic device to the electronic device via the first connector, and a second bandwidth is provided from the second electronic device to the electronic device via the second connector.

15. The electronic device of claim 14, wherein the first connector includes a first portion, and the first portion is configured to transmit a first signal.

16. The electronic device of claim 15, wherein the second connector is configured to transmit a second signal.

17. The electronic device of claim 15, wherein the first connector includes a second portion, and the second portion is configured to provide power from the circuit board.

18. The electronic device of claim 16, wherein the first signal and the second signal are compatible.

19. The electronic device of claim 14, wherein the distance between the first connector and the second connector is approximately 1 mm to 50 mm.

20. The electronic device of claim 14, further comprising:
a fourth connector adjacent to the second connector,
wherein the fourth connector and the second connector are the same, and
wherein the fourth connector and the second connector are arranged in parallel.

* * * * *